(12) United States Patent
Huang

(10) Patent No.: US 11,978,670 B2
(45) Date of Patent: May 7, 2024

(54) SELF ALIGNED CONTACT SCHEME

(71) Applicant: Taiwan Semiconductor Manufacturing Co., Ltd., Hsinchu (TW)

(72) Inventor: Yu-Lien Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 95 days.

(21) Appl. No.: 17/717,730

(22) Filed: Apr. 11, 2022

(65) Prior Publication Data

US 2022/0238375 A1  Jul. 28, 2022

Related U.S. Application Data

(62) Division of application No. 16/746,544, filed on Jan. 17, 2020, now Pat. No. 11,302,577.

(51) Int. Cl.
| | |
|---|---|
| *H01L 21/768* | (2006.01) |
| *H01L 21/033* | (2006.01) |
| *H01L 21/308* | (2006.01) |
| *H01L 21/311* | (2006.01) |

(52) U.S. Cl.
CPC .... *H01L 21/76897* (2013.01); *H01L 21/0337* (2013.01); *H01L 21/3081* (2013.01); *H01L 21/3086* (2013.01); *H01L 21/31144* (2013.01); *H01L 21/76802* (2013.01); *H01L 21/76834* (2013.01)

(58) Field of Classification Search
CPC ......... H01L 21/76897; H01L 21/76834; H01L 21/31144; H01L 21/3081; H01L 21/0337; H01L 21/3086; H01L 21/76802; H01L 21/76831; H01L 21/76883; H01L 21/76832; H01L 21/823431; H01L 21/823475; H01L 27/0886; H01L 21/28141; H01L 21/28247; H01L 21/823437; H01L 21/823468
USPC ........................................................ 257/773
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

FOREIGN PATENT DOCUMENTS

| | | |
|---|---|---|
| KR | 20010008589 A | 2/2001 |
| KR | 20080001883 A | 1/2008 |

(Continued)

OTHER PUBLICATIONS

Li, et al. "Fluorocarbon based atomic layer etching of Si3N4 and etching selectivity of SiO2 over Si3N4" Journal of Vacuum Science & Technology A, American Vacuum Society, 34(4), Jul./Aug. 2016, 13 pages.

(Continued)

*Primary Examiner* — Caleen O Sullivan
(74) *Attorney, Agent, or Firm* — Slater Matsil, LLP

(57) ABSTRACT

A method includes using a second hard mask layer over a gate stack to protect the gate electrode during etching a self-aligned contact. The second hard mask is formed over a first hard mask layer, where the first hard mask layer has a lower etch selectivity than the second hard mask layer.

20 Claims, 31 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,852,947 B1 | 12/2017 | Ko et al. |
| 9,859,386 B2 | 1/2018 | Ho et al. |
| 10,164,053 B1 | 12/2018 | Chung et al. |
| 2011/0156107 A1 | 6/2011 | Bohr et al. |
| 2017/0288031 A1 | 10/2017 | Ho et al. |
| 2020/0119009 A1 | 4/2020 | Kim et al. |

FOREIGN PATENT DOCUMENTS

| | | |
|---|---|---|
| KR | 20130112962 A | 10/2013 |
| KR | 20130140231 A | 12/2013 |
| KR | 20140119201 A | 10/2014 |
| KR | 20170123378 A | 11/2017 |
| KR | 20190024529 A | 3/2019 |
| TW | 201814832 A | 4/2018 |

OTHER PUBLICATIONS

Honda et al., "Plasma-Enhanced Quasi-ALE and ALD Processing for Leading-Edge Microfabrication," Advanced Processed Development Laboratory, Tokyo Electron Miyagi Ltd., The Electrochemical Society, 8 pages, Japan.

SELF ALIGNED CONTACT SCHEME

PRIORITY CLAIM AND CROSS-REFERENCE

This application is a divisional of U.S. application Ser. No. 16/746,544, filed on Jan. 17, 2020, now U.S. Pat. No. 11,302,577, issued on Apr. 12, 2022, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

In particular, as designs shrink, conductive features connecting to layers above and below may become shorted if the conductive feature is misaligned. Generally, this occurs when the etching process through the layer is misaligned such that the conductive feature exposes portions of an adjacent conductive feature on the layer below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
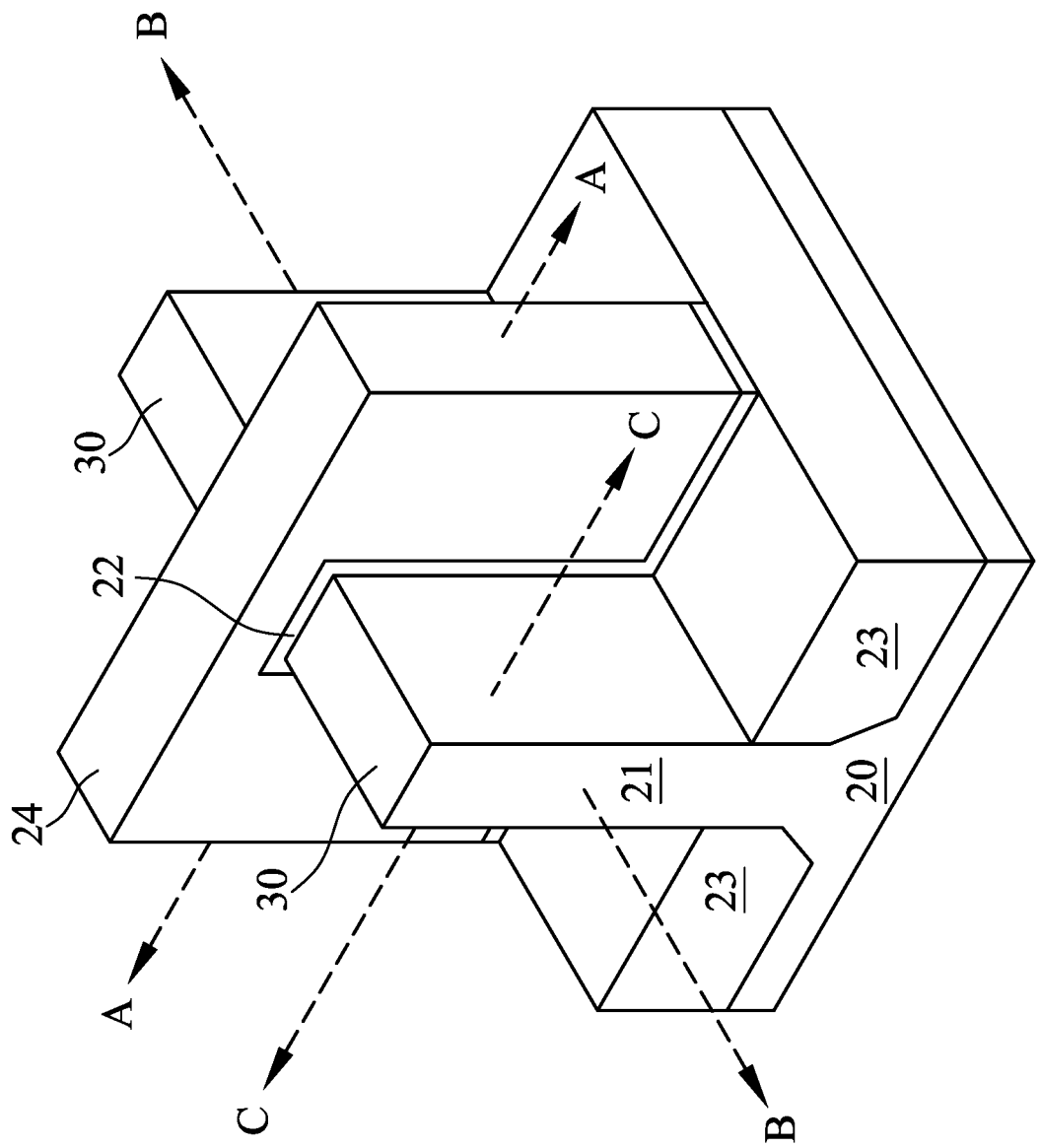
FIG. 1 illustrates a perspective view of a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below with respect to a specific context, namely a self-alignment scheme. The self-alignment scheme utilizes multiple mask layers overlying conductive features of the lower layers to protect the conductive features from unintended exposure during contact opening etching processes.

Some embodiments discussed herein are discussed in the context of field-effect transistors (FETs) formed using a gate-last process. In other embodiments, a gate-first process may be used. Also, some embodiments contemplate aspects used in planar devices, such as planar FETs, or fin devices, such as FinFETs.

FIG. 1 illustrates an example of a FinFET in a three-dimensional view, in accordance with some embodiments. The FinFET comprises a fin 21 on a substrate 20 (e.g., a semiconductor substrate). Isolation regions 23 are disposed in the substrate 20, and the fin 21 protrudes above and from between neighboring isolation regions 23. Although the isolation regions 23 are described/illustrated as being separate from the substrate 20, as used herein the term "substrate" may be used to refer to just the semiconductor substrate or a semiconductor substrate inclusive of isolation regions. Additionally, although the fin 21 is illustrated as a single, continuous material as the substrate 20, the fin 21 and/or the substrate 20 may comprise a single material or a plurality of materials. In this context, the fin 21 refers to the portion extending between the neighboring isolation regions 23.

A gate dielectric layer 22 is along sidewalls and over a top surface of the fin 21, and a gate electrode 24 is over the gate dielectric layer 22. Source/drain regions 30 are disposed in opposite sides of the fin 21 with respect to the gate dielectric layer 22 and gate electrode 24. FIG. 1 further illustrates reference cross-sections that are used in later figures. Cross-section A-A is along a longitudinal axis of the gate electrode 24 and in a direction, for example, perpendicular to the direction of current flow between the source/drain regions 30 of the FinFET. Cross-section B-B is perpendicular to cross-section A-A and is along a longitudinal axis of the fin 21 and in a direction of, for example, a current flow between the source/drain regions 30 of the FinFET. Cross-section C-C is parallel to cross-section A-A and extends through a source/drain region of the FinFET.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
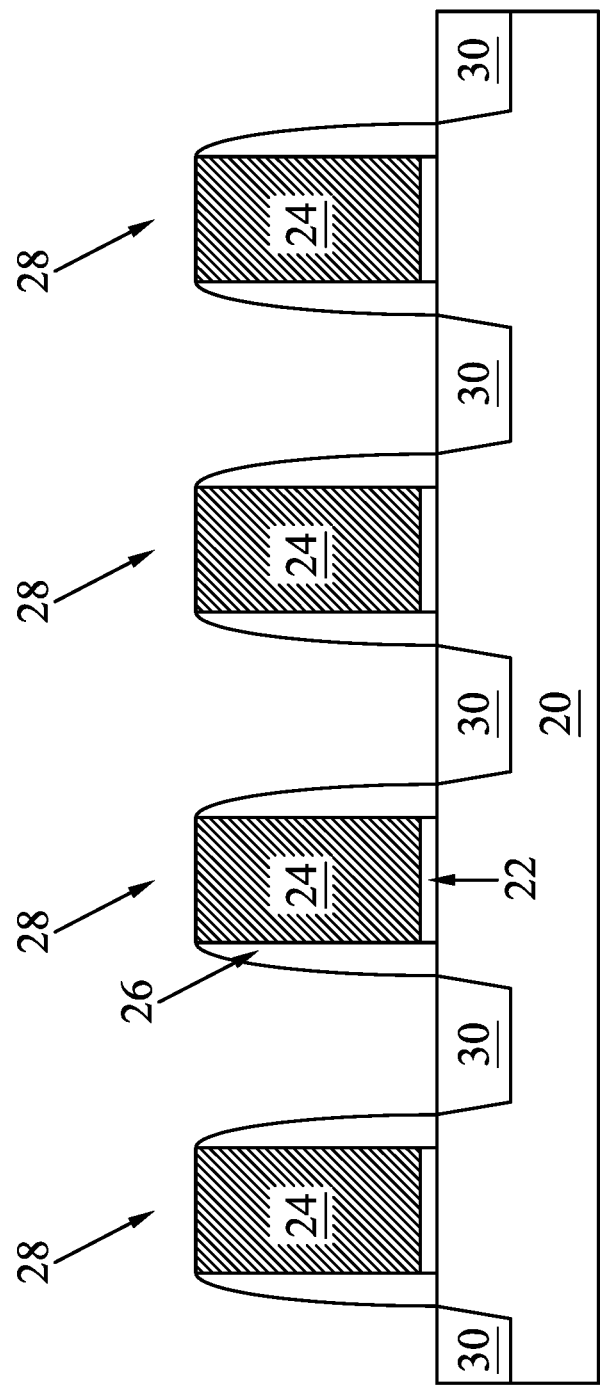
FIGS. 2 through 16 illustrate cross-sectional views of intermediate stages in the manufacturing of a semiconductor device in accordance with some embodiments.

With reference to FIG. 2, FIG. 2 illustrates a substrate 20, dummy gate stacks 28A and 28B, and source/drain regions 30. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Appropriate wells may be formed in the substrate 20. For example, a P well may be formed in the first region of the substrate 20, and an N well may be formed in a second region of the substrate 20.

The different implant steps for the different wells may be achieved using a photoresist or other masks (not shown). For example, a photoresist is formed and patterned to expose the region of the substrate 20 to be implanted. The photoresist can be formed by using a spin-on technique and can be patterned using acceptable photolithography techniques. Once the photoresist is patterned, an n-type impurity and/or a p-type impurity implant is performed in the exposed region, and the photoresist may act as a mask to substantially prevent the impurities from being implanted into the masked region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. The p-type impurities may be boron, BF$_2$, or the like implanted in the second region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

After the implants of the wells, an anneal may be performed to activate the p-type and/or n-type impurities that were implanted. In some embodiments, substrate 20 may include epitaxially grown regions that may be in situ doped during growth, which may obviate the implantations, although in situ and implantation doping may be used together.

The substrate 20 may include active and passive devices (not shown in FIG. 2). As one of ordinary skill in the art will recognize, a wide variety of devices such as transistors, capacitors, resistors, combinations of these, and the like may be used to generate the structural and functional requirements of the semiconductor device. The devices may be formed using any suitable methods. Only a portion of the substrate 20 is illustrated in the figures, as this is sufficient to fully describe the illustrative embodiments.

The substrate 20 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

In some embodiments, the substrate 20 may one or more fins that protrude above and from between neighboring isolation regions. For example, the cross-sectional view of FIG. 2 could be along a longitudinal axis of a fin, for example along the B-B cross-sectional view from FIG. 1. These one or more fins may be formed in various different processes. In one example, the fins can be formed by etching trenches in a substrate to form semiconductor strips; the trenches can be filled with a dielectric layer; and the dielectric layer can be recessed such that the semiconductor strips protrude from the dielectric layer to form fins. In another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In still another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The gate stacks 28 (including 28A and 28B) are formed over the substrate 20. The gate stacks 28 may include a dummy gate dielectric 22, a hard mask (not shown), and a dummy gate electrode 24. The dummy gate dielectric layer (not shown) may be formed by thermal oxidation, chemical vapor deposition (CVD), sputtering, or any other methods known and used in the art for forming a gate dielectric. In some embodiments, the dummy gate dielectric layer includes dielectric materials having a high dielectric constant (k value), for example, greater than 3.9. The dummy gate dielectric materials include silicon nitrides, oxynitrides, metal oxides such as HfO$_2$, HfZrO$_x$, HfSiO$_x$, HfTiO$_x$, HfAlO$_x$, the like, or combinations and multi-layers thereof.

The dummy gate electrode layer (not shown) may be formed over the dummy gate dielectric layer. The dummy gate electrode layer may comprise a conductive material and may be selected from a group comprising polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate electrode layer may be deposited by physical vapor deposition (PVD), CVD, sputter deposition, or other techniques known and used in the art for depositing conductive materials. After deposition, a top surface of the dummy gate electrode layer usually has a non-planar top surface, and may be planarized, for example, by a chemical mechanical polishing (CMP) process, prior to patterning of the dummy gate electrode layer or gate etch. Ions may or may not be introduced into the dummy gate electrode layer at this point. Ions may be introduced, for example, by ion implantation techniques.

A hard mask layer (not shown) is formed over the dummy gate electrode layer. The hard mask layer may be made of SiN, SiON, SiO$_2$, the like, or a combination thereof. The hard mask layer is then patterned. The patterning of the hard mask layer may be accomplished by depositing mask material (not shown) such as photoresist over the hard mask layer. The mask material is then patterned and the hard mask layer is etched in accordance with the pattern to form hard masks. The dummy gate electrode layer and the dummy gate dielectric layer may be patterned to form the dummy gate electrodes 24 and dummy gate dielectrics 22, respectively. The gate patterning process may be accomplished by using the hard masks as a pattern and etching the dummy gate electrode layer and the dummy gate dielectric layer to form the gate stacks 28.

After the formation of the gate stacks 28, source/drain regions 30 may be formed in the substrate 20. The source/drain regions 30 may be doped by performing an implanting process to implant appropriate dopants to complement the dopants in the substrate 20. In another embodiment, the source/drain regions 30 may be formed by forming recesses (not shown) in substrate 20 and epitaxially growing material in the recesses. The source/drain regions 30 may be doped either through an implantation method as discussed above, or else by in-situ doping as the material is grown. In this embodiment, epitaxial source/drain regions 30 may include any acceptable material, such as appropriate for n-type FETs and/or p-type FETs. For example, in an n-type configuration, if the substrate 20 is silicon, the epitaxial source/drain regions 30 may include silicon, SiC, SiCP, SiP, or the like. For example, in an p-type configuration, if the substrate 20 is silicon, the epitaxial source/drain regions 30 may comprise SiGe, SiGeB, Ge, GeSn, or the like. The epitaxial source/drain regions 30 may have surfaces raised above top surfaces of the substrate 20 and may have facets.

In an embodiment, the gate stacks 28 and the source/drain regions 30 may form transistors, such as metal-oxide-semiconductor FETs (MOSFETs). In these embodiments, the MOSFETs may be configured in a PMOS or an NMOS configuration. In a PMOS configuration, the substrate 20 is doped with n-type dopants and the source/drain regions 30 are doped with p-type dopants. In an NMOS configuration, the substrate is doped with p-type dopants and the source/drain regions 30 are doped with n-type dopants.

Gate spacers 26 are formed on opposite sides of the gate stacks 28. The gate spacers 26 are formed by blanket depositing a spacer layer (not shown) on the previously formed gates stacks 28. In an embodiment, the gate spacers 26 include a spacer liner, otherwise referred to as a gate seal spacer. The spacer liner may be made of SiN, SiC, SiGe, oxynitride, oxide, the like, or a combination thereof. The spacer layer may comprise SiN, oxynitride, SiC, SiON, oxide, combinations thereof, or the like and may be formed by methods utilized to form such a layer, such as CVD, plasma enhanced CVD (PECVD), low pressure CVD (LPCVD), atomic layer deposition (ALD), sputter, the like, or a combination thereof. The gate spacers 26 are then patterned, for example, by an anisotropic etch to remove the spacer layer from horizontal surfaces, such as top surfaces of the gate stacks 28 and a top surface of the substrate 20.

In another embodiment, the source/drain regions 30 may include a lightly doped region (sometimes referred to as a LDD region) and a heavily doped region. In this embodiment, before the gate spacers 26 are formed, the source/drain regions 30 lightly doped with an implantation process using the gate stacks 28 as masks. After the gate spacers 26 are formed, the source/drain regions 30 may then be heavily doped with an implantation process using the gate stacks 28 and gate spacers 26 as masks. This forms lightly doped regions and heavily doped regions. The lightly doped regions are primarily underneath the gate spacers 26 while the heavily doped regions are outside of the gate spacers along the substrate 20.

As illustrated in FIG. 2, the gate stack 28B has a width that is greater than the widths of the dummy gate stacks 28A. In addition, the pitch between the dummy gate stack 28B and the nearest dummy gate stack 28A is larger than the pitch between the dummy gate stacks 28A. The locations of these different types of gate stacks 28 are to illustrate various configurations of the disclosed embodiments and the locations of the various gate stacks are not limited to these exact locations.

Figure 3:
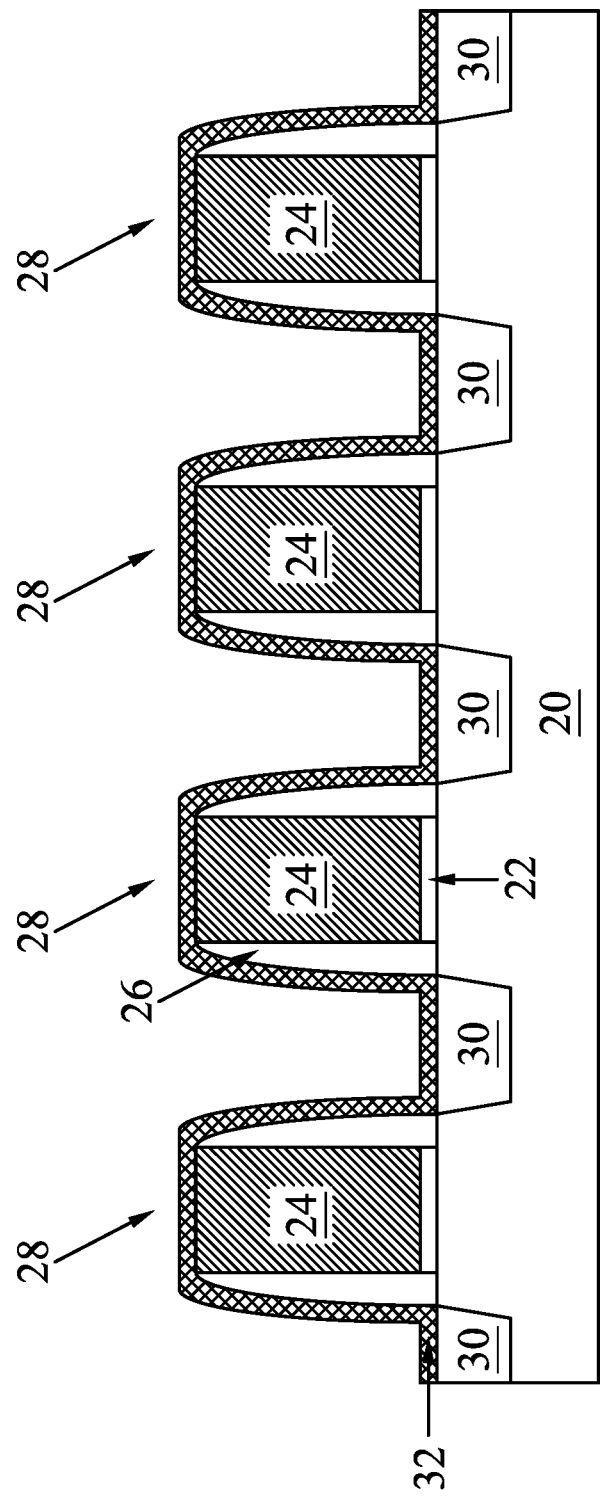

FIG. 3 illustrates the formation of an etch stop layer 32 over the substrate 20, the gate stacks 28, the gate spacers 26, and the source/drain regions 30. The etch stop layer 32 may be conformally deposited over components on the substrate 20. In some embodiments, the etch stop layer 32 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

Figure 4:
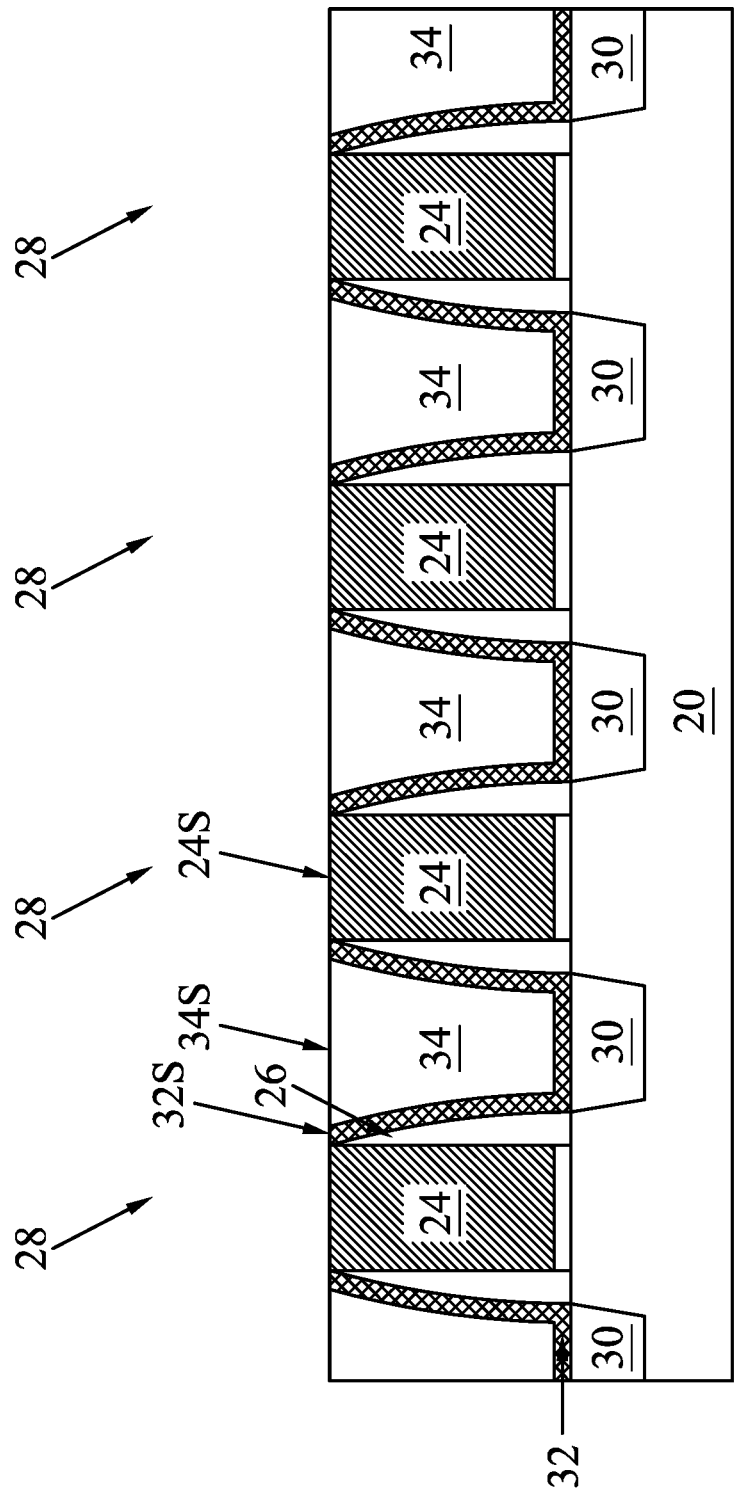

In FIG. 4, an interlayer dielectric (ILD) 34 is deposited over the structure illustrated in 2. In an embodiment, the ILD 34 is a flowable film formed by a flowable CVD. In some embodiments, the ILD 34 is formed of oxides such as silicon oxide, Phospho-Silicate Glass (PSG), Boro-Silicate Glass (BSG), Boron-Doped Phospho-Silicate Glass (BPSG), undoped Silicate Glass (USG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 34 may be deposited by any suitable method such as by CVD, ALD, a spin-on-dielectric (SOD) process, the like, or a combination thereof.

Further in FIG. 4, a planarization process, such as a CMP process, may be performed to level the top surface 34S of the ILD 34 with top surfaces 24S of the dummy gates electrodes 24 and top surfaces 32S of the etch stop layer 32. The CMP process may also remove the hard masks, if present, on the dummy gates electrodes 24. Accordingly, top surfaces 24S of the dummy gates electrodes 24 are exposed through the ILD 34.

Figure 5:
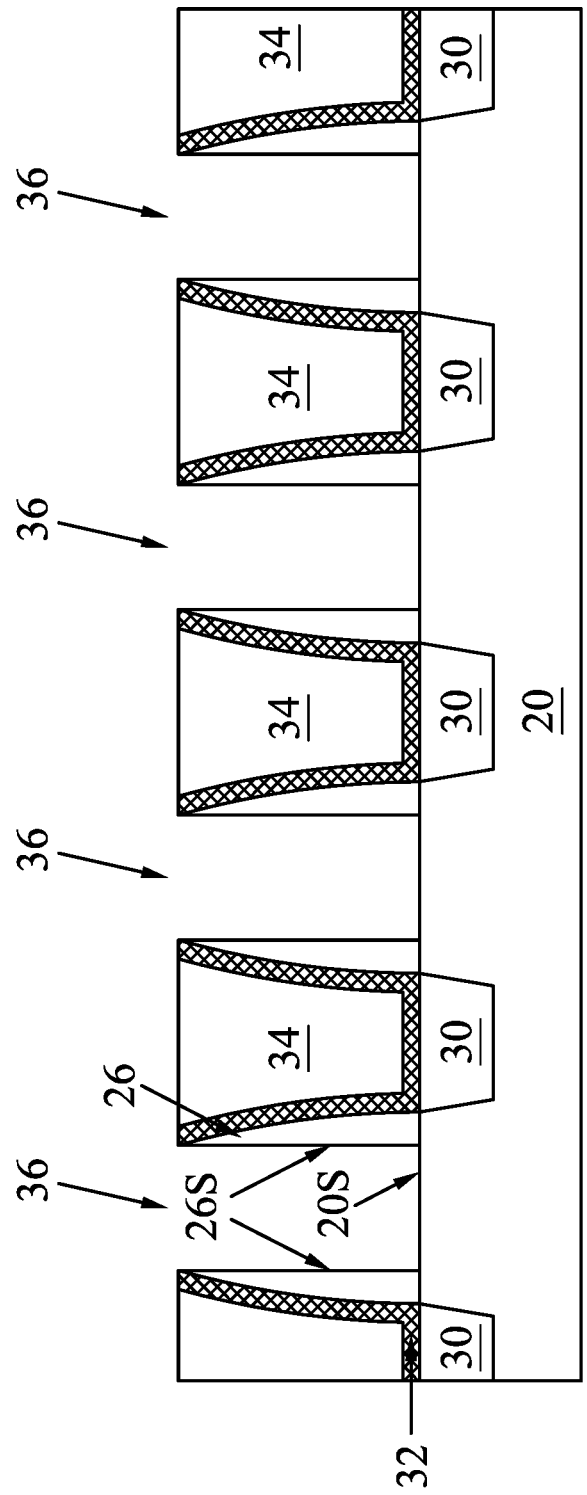

In FIG. 5, the dummy gate electrodes 24 and the dummy gate dielectrics 22 directly underlying the dummy gate electrodes 24 are removed in an etching step(s), so that recesses 36 are formed. Each recess 36 exposes a channel region of a respective FET in the embodiment where MOSFETs are being formed. Each channel region is disposed between neighboring pairs of source/drain regions 30. During the removal, the dummy gate dielectrics 22 may be used as an etch stop layer when the dummy gate electrodes 24 are etched. The dummy gate dielectrics 22 may then be removed after the removal of the dummy gate electrodes 24 The recesses 36 are defined by the exposed surfaces 20S of the substrate 20 and exposed inner surfaces 26S of the gate spacers 26.

Figure 6:
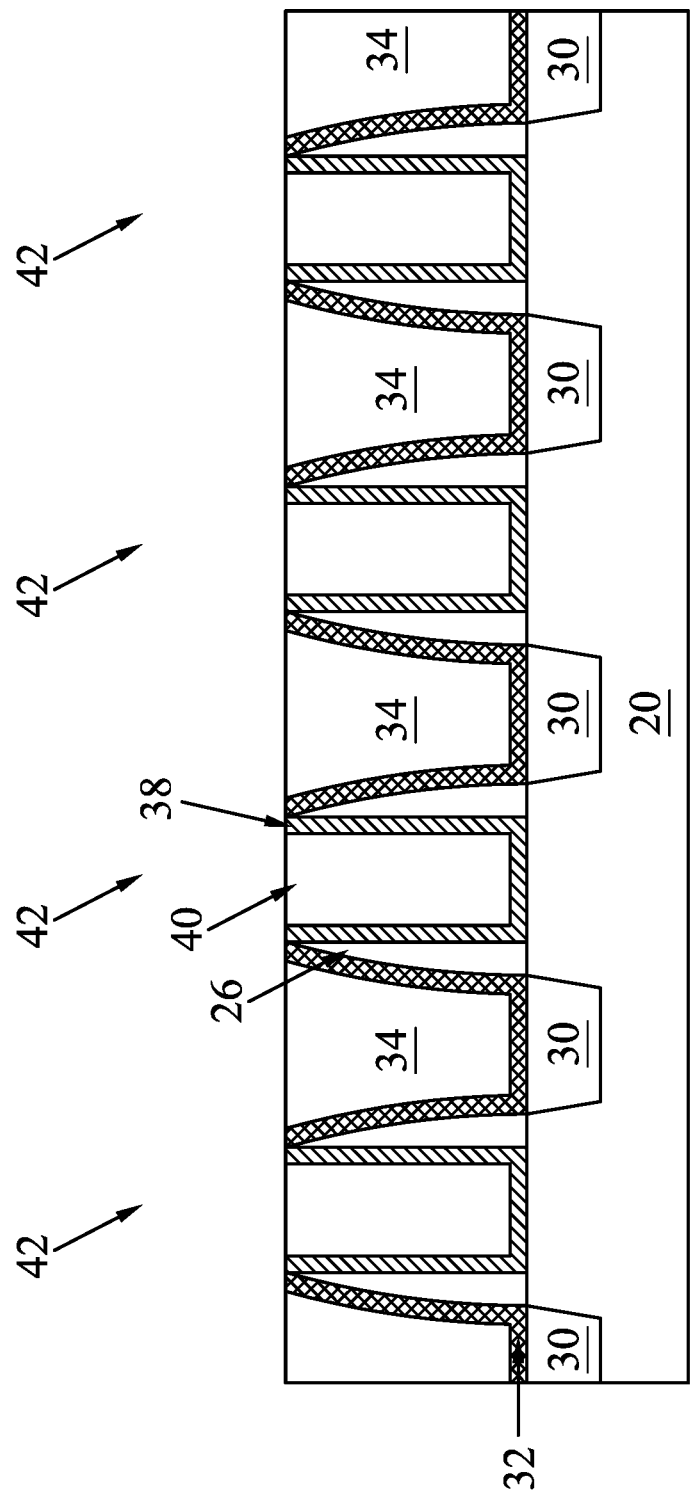

In FIG. 6, gate dielectric layers 38 and gate electrodes 40 are formed for replacement gates. The gate dielectric layers 38 are deposited conformally in recesses 36, such as on the top surface of the substrate and on sidewalls of the gate spacers 26, and on a top surface of the ILD 34. In accordance with some embodiments, gate dielectric layers 38 comprise silicon oxide, silicon nitride, or multilayers thereof. In other embodiments, gate dielectric layers 38 include a high-k dielectric material, and in these embodiments, gate dielectric layers 38 may have a k value greater than about 7.0, and may include a metal oxide or a silicate of Hf, Al, Zr, La, Mg, Ba, Ti, Pb, and combinations thereof. The formation methods of gate dielectric layers 38 may include molecular-beam deposition (MBD), ALD, PECVD, and the like.

Next, gate electrodes 40 are deposited over gate dielectric layers 38, respectively, and fill the remaining portions of the recesses 36. Gate electrodes 40 may be made of a metal-containing material such as TiN, TaN, TaC, Co, Ru, Al, combinations thereof, or multi-layers thereof. After the filling of gate electrodes 40, a planarization process, such as a CMP process, may be performed to remove the excess portions of gate dielectric layers 38 and the material of gate electrodes 40, which excess portions are over the top surface of ILD 34. The resulting remaining portions of material of gate electrodes 40 and gate dielectric layers 38 thus form replacement gates 42.

In a complementary MOS (CMOS) embodiment with both NMOS and PMOS devices on the substrate 20, the formation of the gate dielectric layers 38 in both the PMOS and NMOS regions may occur simultaneously such that the gate dielectric layers 38 in both the PMOS and NMOS regions are made of the same materials, and the formation of the gate electrodes 40 in both the PMOS and NMOS regions may occur simultaneously such that the gate electrodes 40 in both the PMOS and NMOS regions are made of the same materials. However, in other embodiments, the gate dielectric layers 38 in the NMOS region and the PMOS region may be formed by distinct processes, such that the gate dielectric layers 38 in the NMOS region and the PMOS region may be made of different materials, and the gate electrodes 40 in the NMOS region and the PMOS region may be formed by distinct processes, such that the gate electrodes 40 in the NMOS region and the PMOS region may be made of different materials. Various masking steps may be used to mask and expose appropriate regions when using distinct processes.

Figure 7:
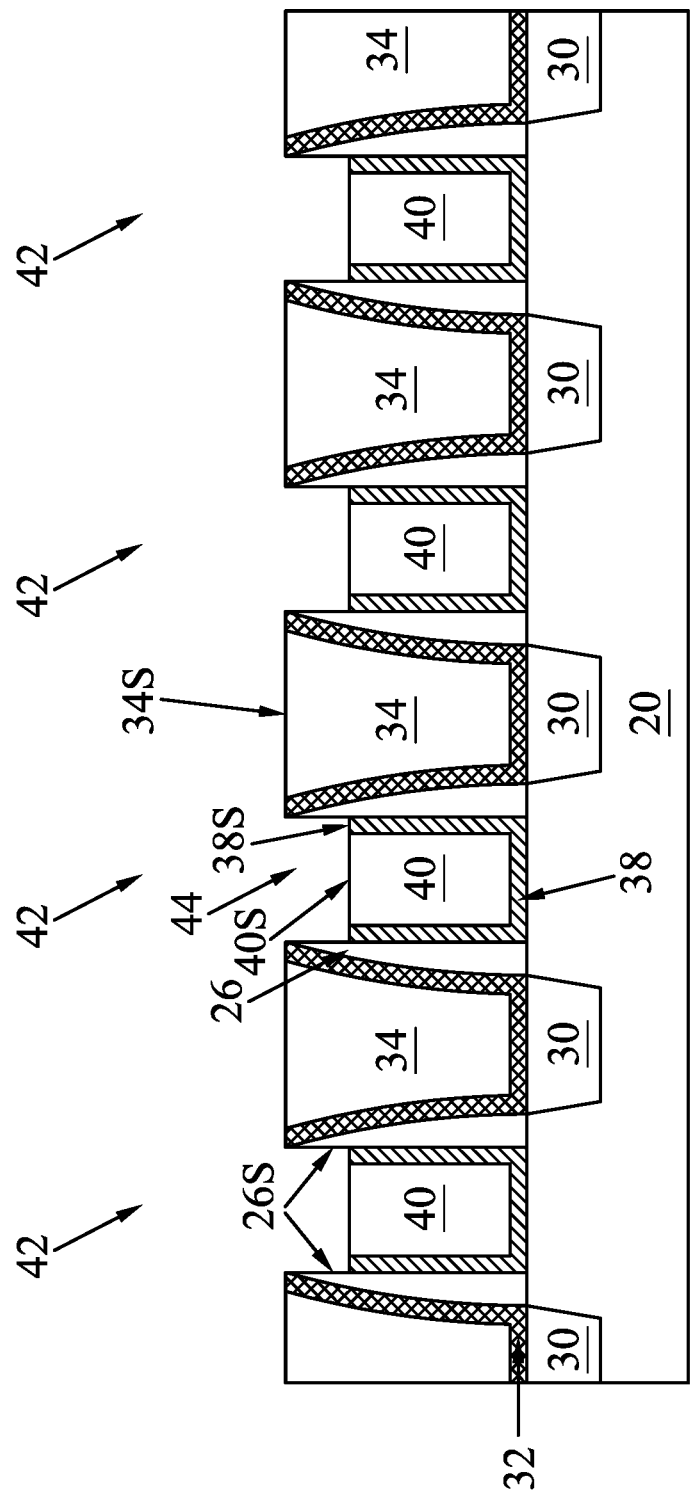

In FIG. 7, the gate electrodes 40 and the gate dielectrics 38 are recessed in an etching step(s), so that recesses 44 are formed. The recesses 44 allow for subsequently formed hard masks to be formed within the recesses 44 to protect the replacement gates 42. The recesses 44 are defined by the exposed inner surfaces 26S of the gate spacers 26 and the recessed top surfaces 40S and 38S of the gate electrodes 40 and gate dielectrics 38, respectively.

Further, the bottom surfaces of the recesses 44 may have a flat surface as illustrated, a convex surface, a concave surface (such as dishing), or a combination thereof. The bottom surfaces of the recesses 44 may be formed flat, convex, and/or concave by an appropriate etch. The gate electrodes 40 and the gate dielectrics 38 may be recessed using an acceptable etching process, such as one that is selective to the materials of the gate electrodes 40 and the gate dielectrics 38.

Figure 8:
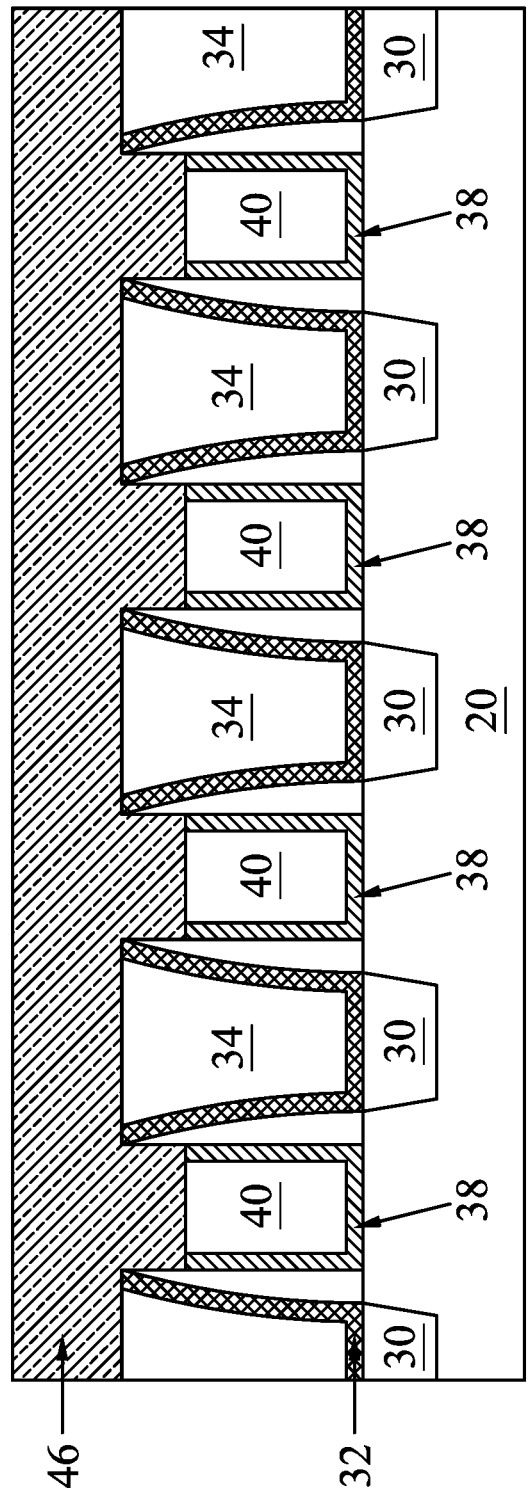

In FIG. 8, a first hard mask layer 46 is formed over the ILD 34 and within the recesses 44 over gate electrodes 40 and the gate dielectrics 38. The first hard mask layer 46 may be made of SiN, SiON, $SiO_2$, the like, or a combination thereof. The first hard mask layer 46 may be formed by CVD, PVD, ALD, a spin-on-dielectric process, the like, or a combination thereof.

Figure 9:
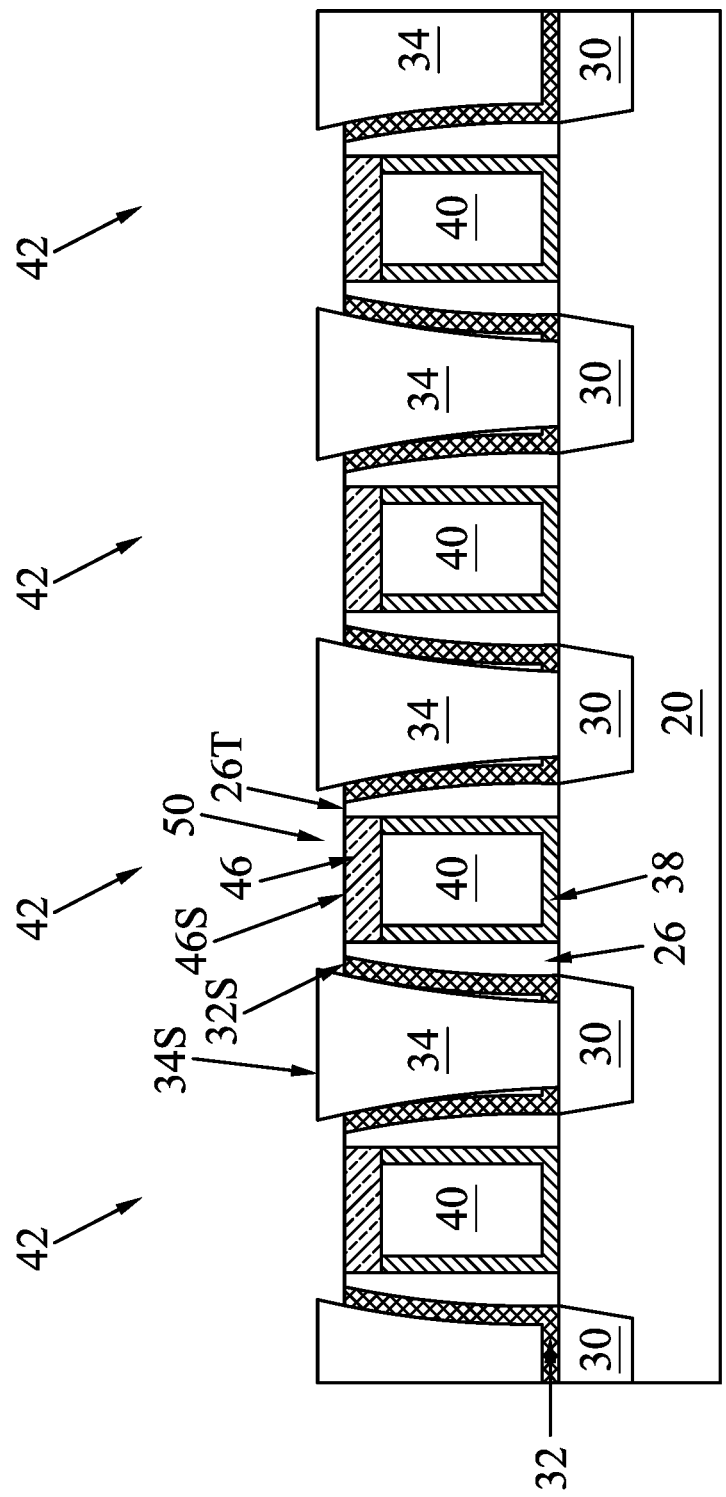

FIG. 9 illustrates recessing the first hard mask layer 46 to form recesses 50. The first hard mask layer 46, the etch stop layer 32, and the gate spacers 26 are recessed such that top surfaces 46S, 32S, and 26T of the first hard mask layer 46, the etch stop layer 32, and the gate spacers 26, respectively, are below top surfaces 34S of the ILD 34.

Further, the bottom surfaces of the recesses 50 may have a flat surface as illustrated, a convex surface, a concave surface (such as dishing), or a combination thereof. The bottom surfaces of the recesses 50 may be formed flat, convex, and/or concave by an appropriate etch. The first hard mask layer 46 may be recessed using an acceptable etching process, such as one that is selective to the materials of the first hard mask layer 46, the etch stop layer 32, and the gate spacer 26. For example, an etch process may include the formation of a reactive species from an etchant gas using a plasma. In some embodiments, the plasma may be a remote plasma. In some embodiments, the etchant gas may include a fluorocarbon chemistry such as $CH_3F/CH_2F_2/CHF_3/C_4F_6/CF_4/C_4F_8$ and $NF_3/O_2/N_2/Ar/H_2/CH_4/CO/CO_2/COS$, the like, or a combination thereof. In some embodiments, the etchant gas may be supplied to the etch chamber at a total gas flow of from about 5 to about 1000 sccm. In some embodiments, the pressure of the etch chamber during the etch process is from about 10 mtorr to about 50 mtorr. In some embodiments, the etchant gas may comprise between about 5 to about 95 percent hydrogen gas. In some embodiments, the etchant gas may comprise between about 5 to about 95 percent inert gas.

In another embodiment, the etching may be a wet etch using a suitable etchant such as $H_3PO_4$, or the like. In such embodiments, a further mask (not shown) may be patterned and used over the ILD 34 to provide protection of the ILD 34 during the etching process. As the first hard mask layer 46 is etched and reduced in thickness, a lateral etch may proceed outwardly from the first hard mask layer 46 over the gate electrodes 40 to remove exposed portions of the gate spacers 26 and etch stop layer 32. In some embodiments, the lateral etch may continue partially into the sidewalls of the ILD 34.

Figure 10:
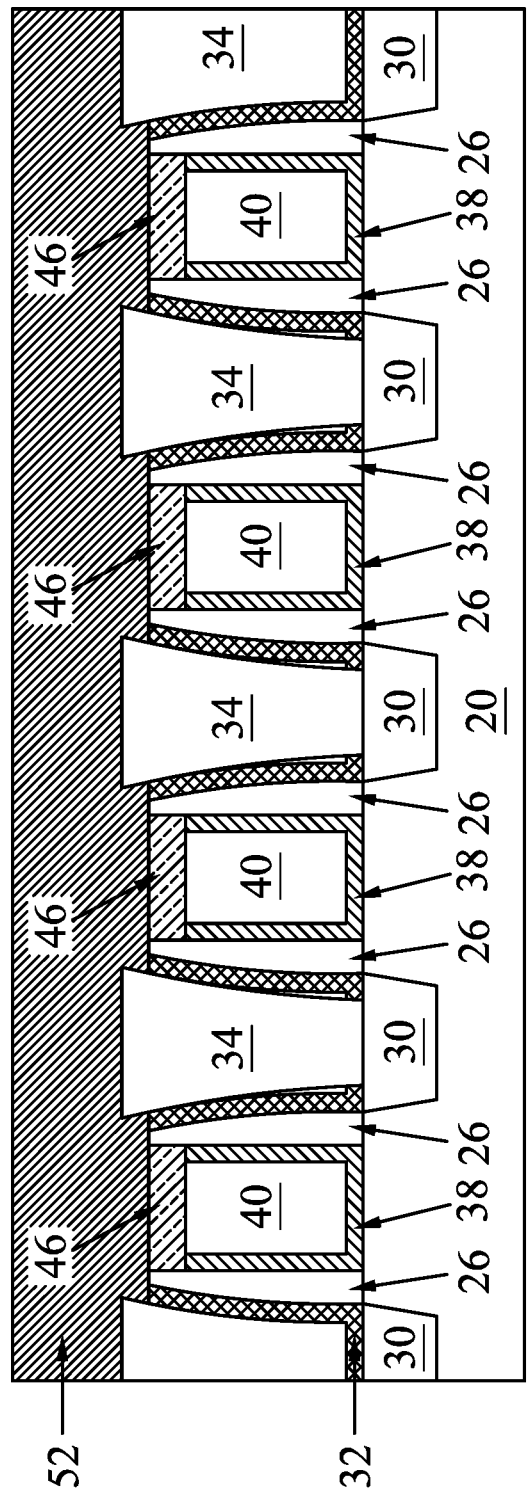

In FIG. 10, a second hard mask layer 52 is formed over the first hard mask layer 46, the gate spacers 26, the etch stop layer 32, and the ILD 34 and within the recesses 50. The second hard mask layer 52 provides protection for the first hard mask layer 46, the gate spacers 26, and the etch stop layer 32 during the subsequent self-aligned contact etching (see FIG. 13) to ensure that the self-aligned contact does not short one of the gate electrodes 40 to the corresponding source/drain region 30 and to reduce current leakage between the self-aligned contact and the gate electrode 40. The second hard mask layer 52 may be made of a silicon oxide, silicon nitride, a metal, a metal oxide, a metal nitride, a metal carbide, pure silicon, the like, or a combination thereof. Some examples of the metal oxide, metal nitride, and metal carbides are TiO, HfO, AlO, ZrO, ZrN, WC, the like, or a combination thereof.

The material composition of the second hard mask layer 52 is different than the material of the first hard mask layer 46. When the recesses for the self-aligned contacts are formed (see FIG. 13), the etching selectivity between the first hard mask layer 46 may be low. Therefore, selecting a material with a high etch selectivity for the second hard mask layer 52 provides less degradation of the protective layers over the gate electrodes 40 during etching the recesses for the self-aligned contacts. For example, in some embodiments, the ratio of the etch selectivity of the first hard mask layer 46 may be less than 8, whereas the ratio of the etch selectivity of the second hard mask layer 52 may be greater than 15. Utilizing the second hard mask layer 52 allows for increased protection of the gate electrodes 40. The second hard mask layer 52 may be formed by CVD, PVD, ALD, a spin-on-dielectric process, the like, or a combination thereof.

Figure 11:
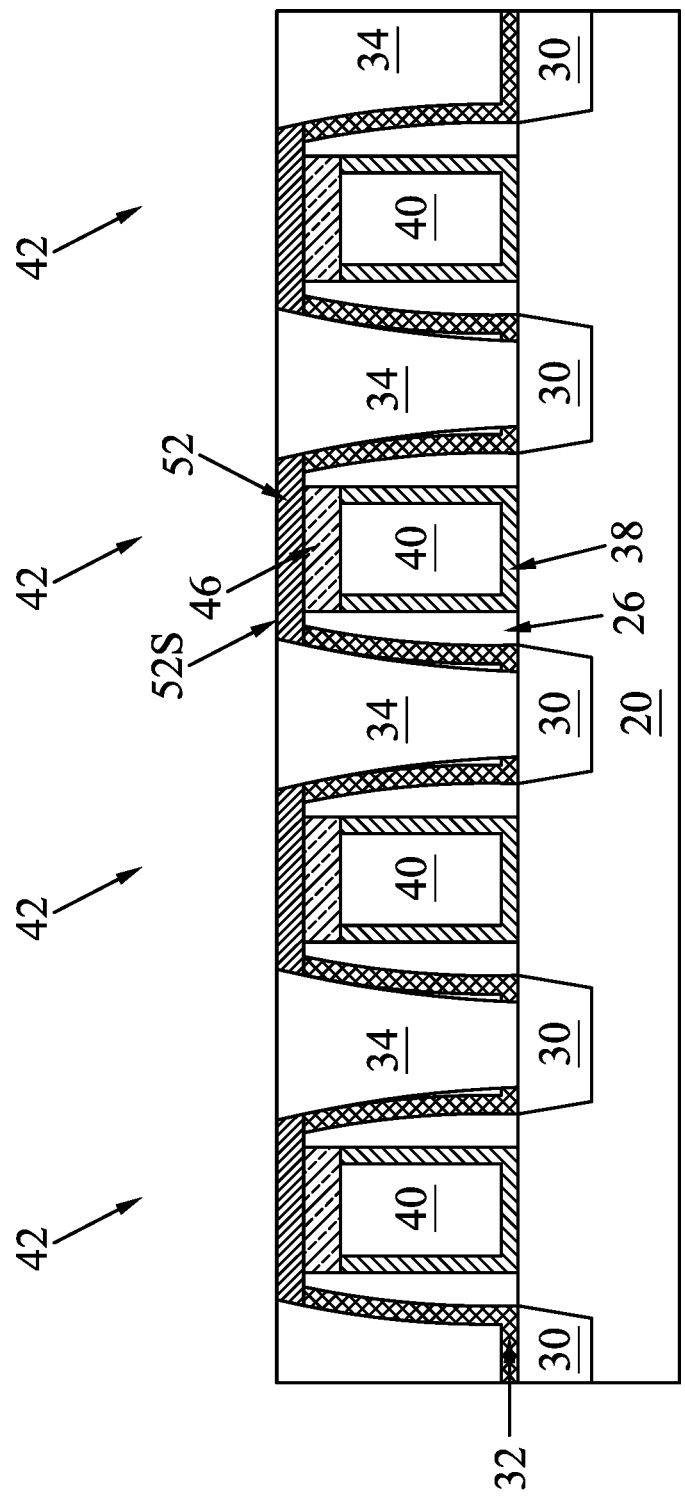

In FIG. 11, a planarization process, such as a CMP process, may be performed to level the top surface 34S of the ILD 34 with top surfaces 52S of the second hard mask layer 52. Accordingly, top surfaces 34S of the ILD 34 are exposed. After planarization, the thickness of the second hard mask layer 52 may be between about 0.5 nm and about 10 nm, such as about 5 nm.

Figure 12:
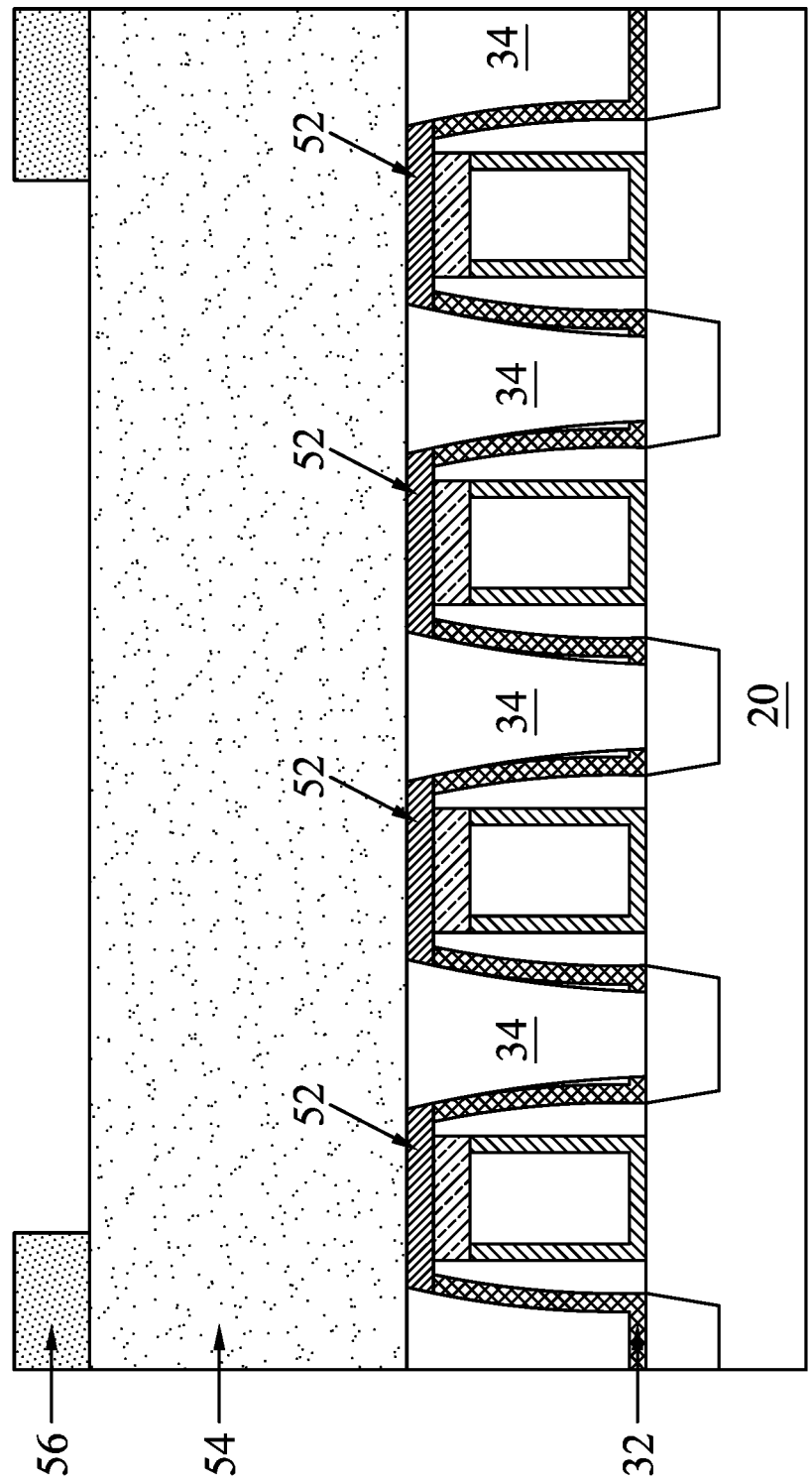

In FIG. 12, an ILD 54 is deposited over the structure illustrated in FIG. 11. In an embodiment, the ILD 54 is a flowable film formed by a flowable CVD. In some embodiments, the ILD 54 is formed of oxides such as silicon oxide, PSG, BSG, BPSG, USG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 54 may be deposited by any suitable method such as by CVD, ALD, a SOD process, the like, or a combination thereof. In some embodiments, the ILD 54 is planarized by a CMP process or an etching process to form a substantially planar top surface.

Further in FIG. 12, a hard mask layer 56 is formed over the ILD 54 and patterned. The hard mask layer 56 may be made of SiN, SiON, SiO$_2$, TiN, TaN, WC, metal oxide the like, or a combination thereof. The hard mask layer 56 may be formed by CVD, PVD, ALD, a SOD process, the like, or a combination thereof. The hard mask layer 56 is then patterned. The patterning of the hard mask layer 56 may be accomplished by depositing mask material (not shown) such as photoresist over the hard mask layer 56. The mask material is then patterned and the hard mask layer 56 is etched in accordance with the pattern to form a patterned hard mask layer 56.

Figure 13:
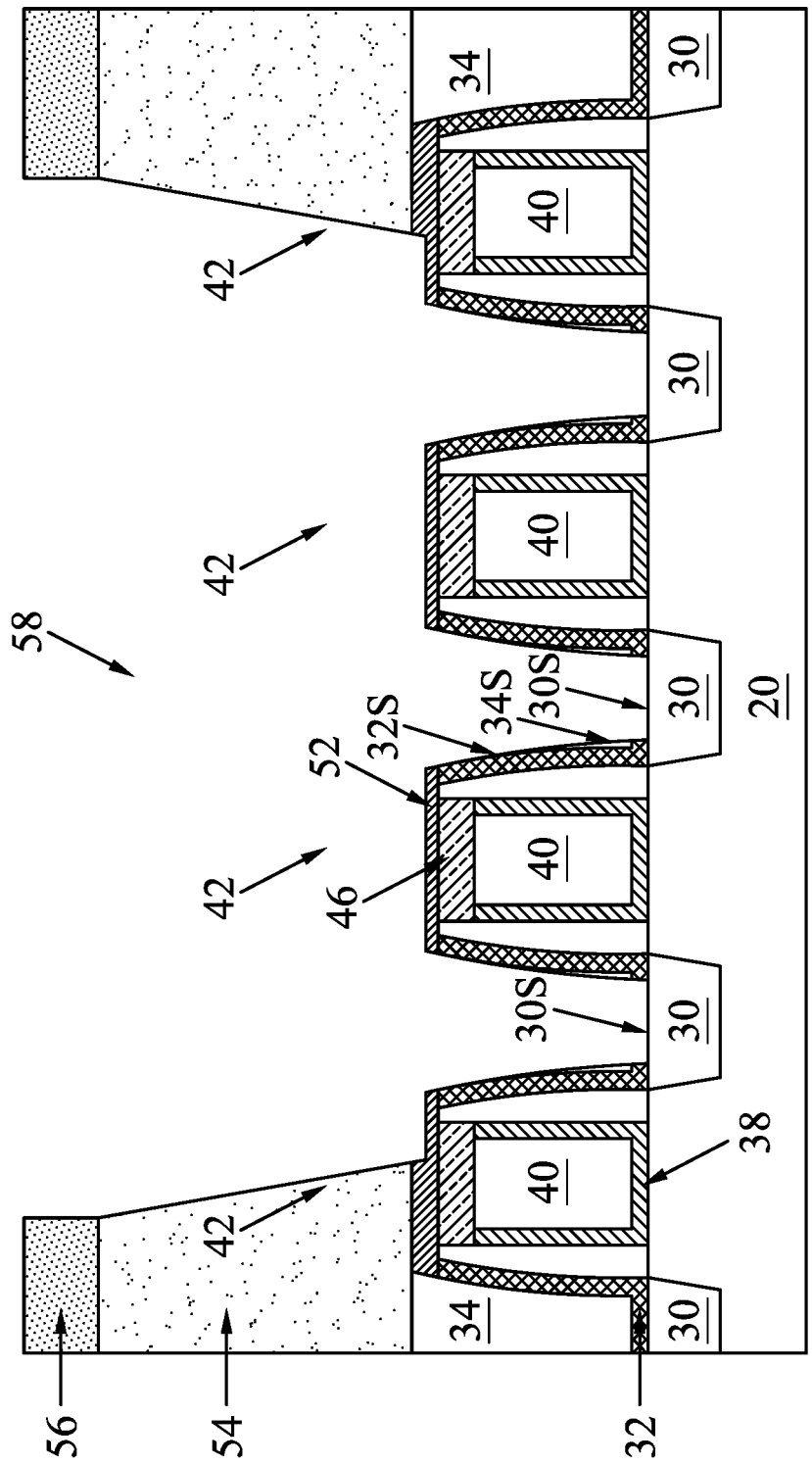

FIG. 13 illustrates the formation of the openings 58 through the ILD 54 and through the ILD 34 using the patterned hard mask layer 56 as a mask to expose portions of the substrate 20. In the illustrated embodiment, the openings 58 expose portions surfaces 30S of the source/drain regions 30. Although portions of the opening 58 extend over top surfaces of the gate stacks 42, the second hard mask layer 52 and the etch stop layer 32 self-align the opening 58 between adjacent gate stacks 42 to the substrate 20. The openings 58 may be formed by using acceptable etching techniques. In an embodiment, the openings 58 are formed by an anisotropic dry etch process. For example, the etching process may include a dry etch process using a reaction gas that selectively etches ILDs 54 and 34 without etching the second hard mask layer 52. As noted above, an etch selectivity ratio of the second hard mask layer 52 may be greater than 15, whereas the etch selectivity ratio of the first hard mask layer 46 may be less than 8. As such, without the second hard mask layer 52, the first hard mask layer 46 would be etched during the formation of the openings 58, and may subsequently cause leakage or shorting from the gate electrode 40 to the subsequently formed contact.

The etch process to form the openings 58 may include the formation of a reactive species from an etchant gas using a plasma. In some embodiments, the plasma may be a remote plasma. The etchant gas may include a fluorocarbon chemistry such as CH$_3$F/CH$_2$F$_2$/CHF$_3$/C$_4$F$_6$/CF$_4$/C$_4$F$_8$ and NF$_3$/O$_2$/N$_2$/Ar/H$_2$/CH$_4$/CO/CO$_2$/COS, the like, or a combination thereof. In some embodiments, the etchant gas may be supplied to the etch chamber at a total gas flow of from about 5 to about 1000 sccm. In some embodiments, the pressure of the etch chamber during the etch process is from about 10 mtorr to about 50 mtorr. Due to the high etch selectivity of the second hard mask layer 52, the second hard mask layer 52 acts like an etch stop layer and advantageously prevents damage to underlying features (e.g., gate spacer 26, first hard mask layer 46, and gate stacks 42). Absent the second hard mask layer 52, the gate spacers 26, the first hard mask layers 46, and the gate stacks 42 may be inadvertently damaged by the etching process. In some embodiments, the etching process used for the self-aligned opening 58 may remove some upper portions of the second hard mask layer 52, but does not completely etch through the second hard mask layer 52 such that the first hard mask layer 46, the gate spacers 26, and the covered portions of the etch stop layer 32 are protected during the etching process. As seen in FIG. 13, other portions of the second hard mask layer 52 which are not in the opening 58 are not etched. As such, the second hard mask layer 52 may have different heights over the gate electrode following the etching process.

Figure 14:
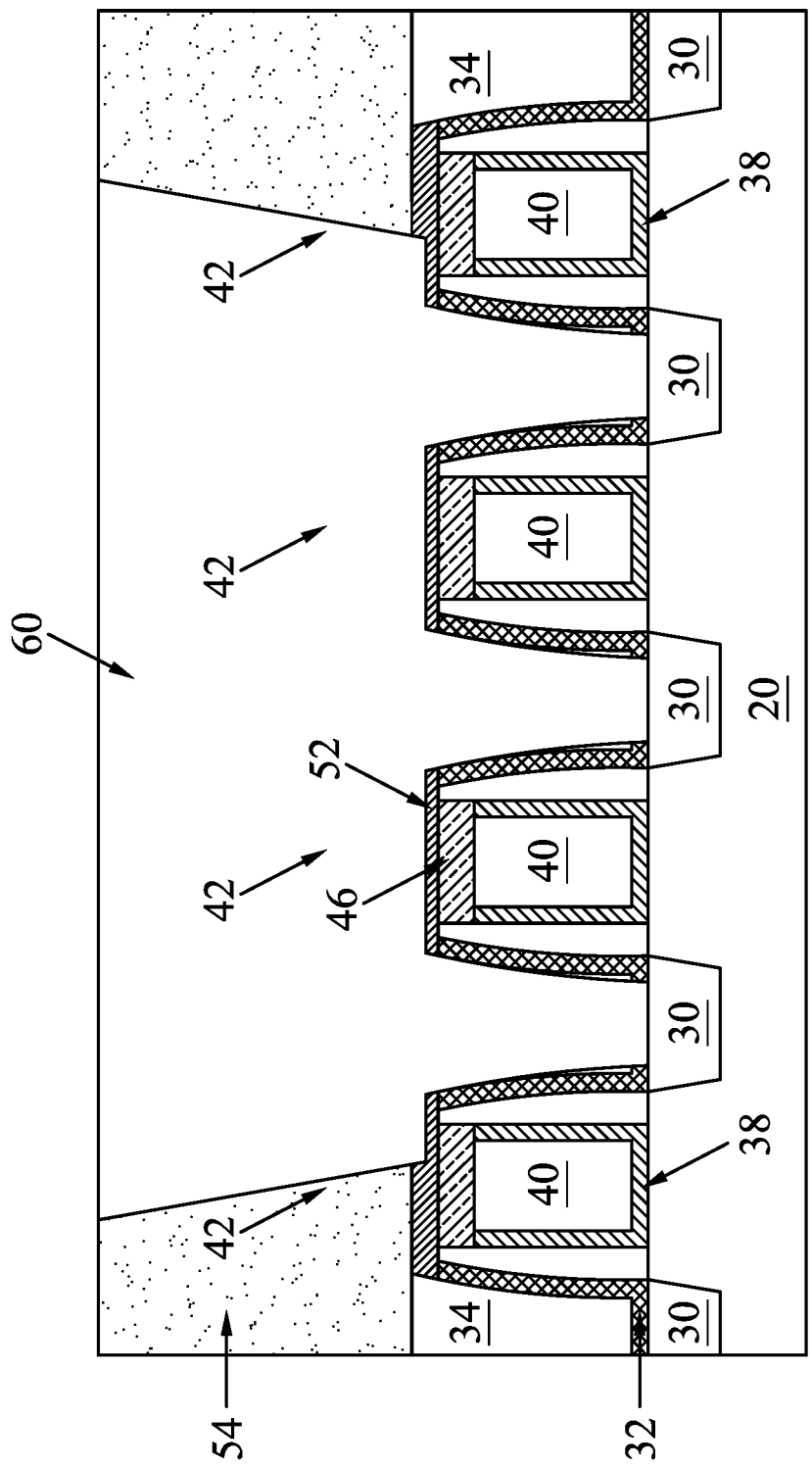

FIG. 14 illustrates the formation of a conductive layer 60 in the openings 58. The conductive layer 60 in the opening 58 contacts the exposed surface of the substrate 20 and is along exposed surfaces of the etch stop layer 32, the ILDs 34 and 54, and top surfaces of the second hard mask layer 52. In the illustrated embodiment, the conductive layer 60 in the openings 58 contacts the exposed surfaces of the source/drain regions 30.

In some embodiments, the conductive layer 60 includes a barrier layer 61. The barrier layer 61 helps to block diffusion of the subsequently formed conductive layer 60 into adjacent dielectric materials such as ILDs 34 and 54. The barrier layer 61 may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer 61 may be formed by CVD, PVD, PECVD, ALD, SOD, the like, or a combination thereof. In some embodiments, the barrier layer 61 is omitted.

The conductive layer 60 may be made of tungsten, copper, aluminum, the like, or a combination thereof. The conductive layer 60 may be formed through a deposition process such as electrochemical plating, PVD, CVD, the like, or a combination thereof. In some embodiments, the conductive layer 60 is formed on a copper containing seed layer, such as AlCu.

In some embodiments, the conductive layer 60 is formed to have excess material overlying a top surface of the ILD 54. In these embodiments, the conductive layer 60 is planarized by a grinding process such as a CMP process to form conductive features 60$_1$, 60$_2$, and 60$_3$ in the openings 58. In some embodiments, the top surfaces of the conductive features 60$_1$, 60$_2$, and 60$_3$ are level with the top surface of the ILD 54 after the planarization process.

Figure 15:
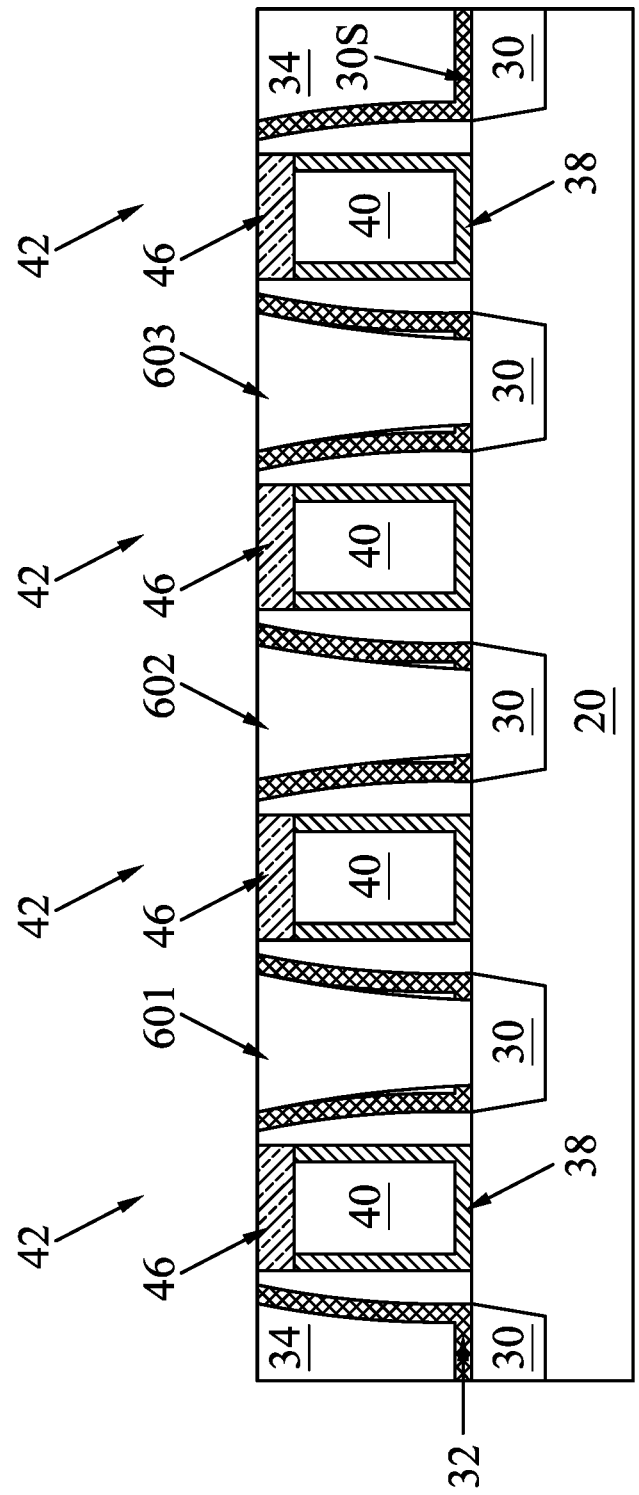

FIG. 15 illustrates the removal of the ILD 54, the second hard mask layer 52, and the portion of the ILD 34 and conductive layer 60 at levels above the top surfaces of the first hard mask layer 46. This removal may be performed by one or more etching processes and/or grinding processes such as CMP processes. After the removal process, the conductive layer 60 is separated into conductive features 601, 602, and 603. In addition, after the removal process, the top surfaces of the conductive features 601, 602, and 603 are level with the top surface of the ILD 34 and the first hard mask layer 46.

Figure 16:
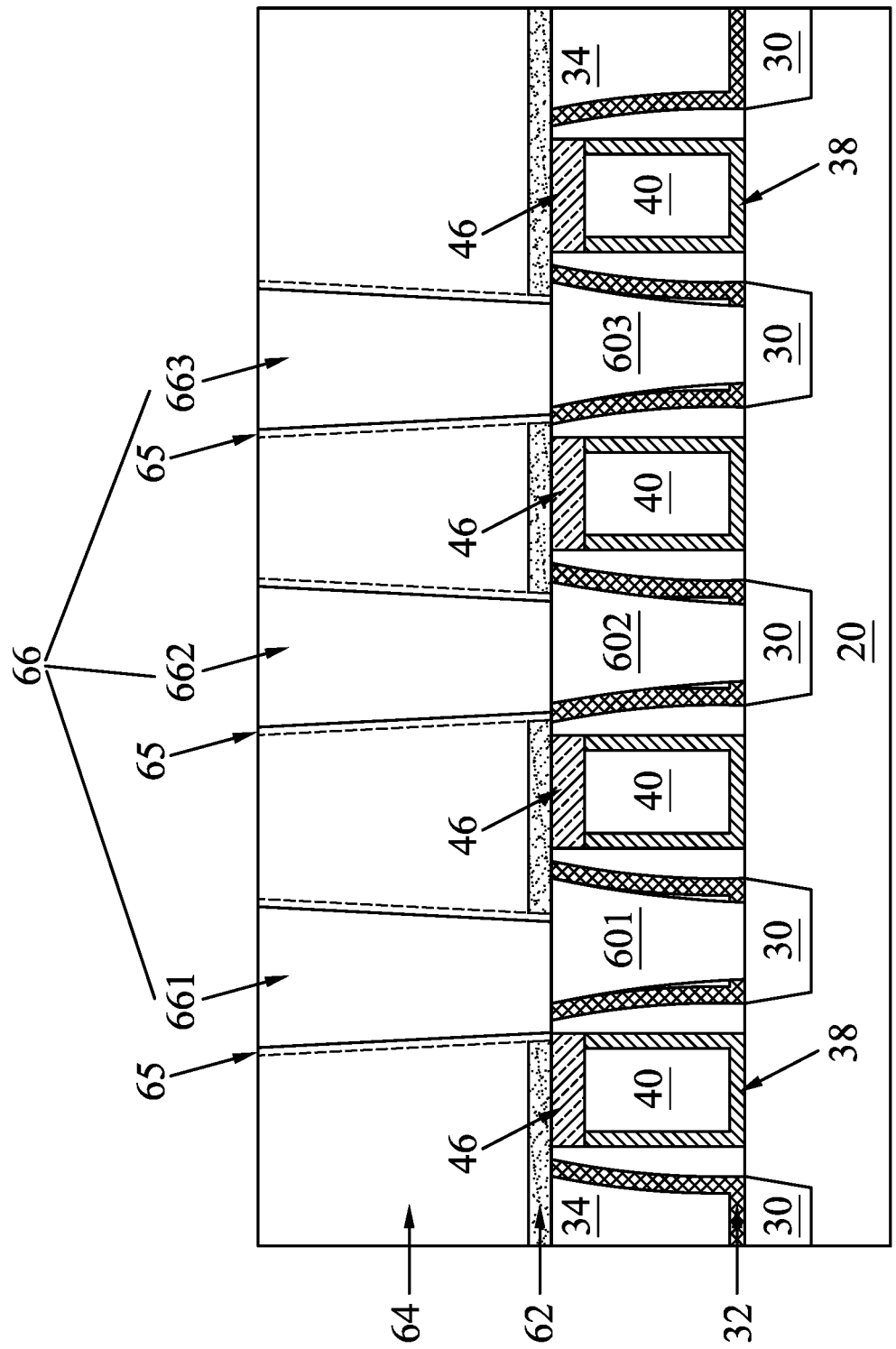

FIG. 16 illustrates the formation of an etch stop layer 62 over the structure of FIG. 15. The etch stop layer 62 is formed over the ILD 34, the etch stop layer 32, the first hard mask layers 46, and the gate spacers 26. The etch stop layer 62 may be conformally deposited over these components. In some embodiments, the etch stop layer 62 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

Further in FIG. 16, an ILD 64 is deposited over the etch stop layer 62. In an embodiment, the ILD 64 is a flowable film formed by a flowable CVD. In some embodiments, the ILD 64 is formed of oxides such as silicon oxide, PSG, BSG, BPSG, USG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 64 may be deposited by any suitable method such as by CVD, ALD, a SOD process, the like, or a combination thereof.

Further in FIG. 16, contacts 661, 662, and 663 (together, the conductive layer 66) are formed through the ILD 64 and the etch stop layer 62 to electrically and physically contact respective conductive features 601, 602, and 603. The openings for the contacts 661, 662, and 663 may be formed by using acceptable etching techniques. In an embodiment, the openings are formed by an anisotropic dry etch process. These openings are filled with the material of the conductive layer 66.

In some embodiments, a liner layer 65 may be deposited to line the openings. The liner layer 65 may be used to provide protection from subsequently formed gate contacts (see FIG. 30). The liner layer 65 may be conformally deposited over the ILD 64 and in the conductive layer 66 openings. In some embodiments, the liner layer 65 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. After formation of the liner layer 65, an anisotropic etching process can remove a bottom portion of the liner layer 65 to expose the upper surface of conductive features 601, 602, and 603.

In some embodiments, the conductive layer 66 includes a barrier layer (not shown). The barrier layer helps to block diffusion of the subsequently formed conductive layer 66 into adjacent dielectric materials such as ILD 64 and etch stop layer 62. The barrier layer may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, PBO the like, or a combination thereof. The barrier layer may be formed by CVD, PVD, PECVD, ALD, SOD, the like, or a combination thereof. In some embodiments, the barrier layer is omitted.

The conductive layer 66 may be made of tungsten, copper, aluminum, the like, or a combination thereof. The conductive layer 66 may be formed through a deposition process such as electrochemical plating, PVD, CVD, the like, or a combination thereof. In some embodiments, the conductive layer 66 is formed on a copper containing seed layer, such as AlCu.

In some embodiments, the conductive layer 66 is formed to have excess material overlying a top surface of the ILD 64. In these embodiments, the conductive layer 66 is planarized by a grinding process such as a CMP process to form contacts 661, 662, and 663. In some embodiments, the top surfaces of the conductive features contacts 661, 662, and 663 are level with the top surface of the ILD 64 after the planarization process.

Figure 17:
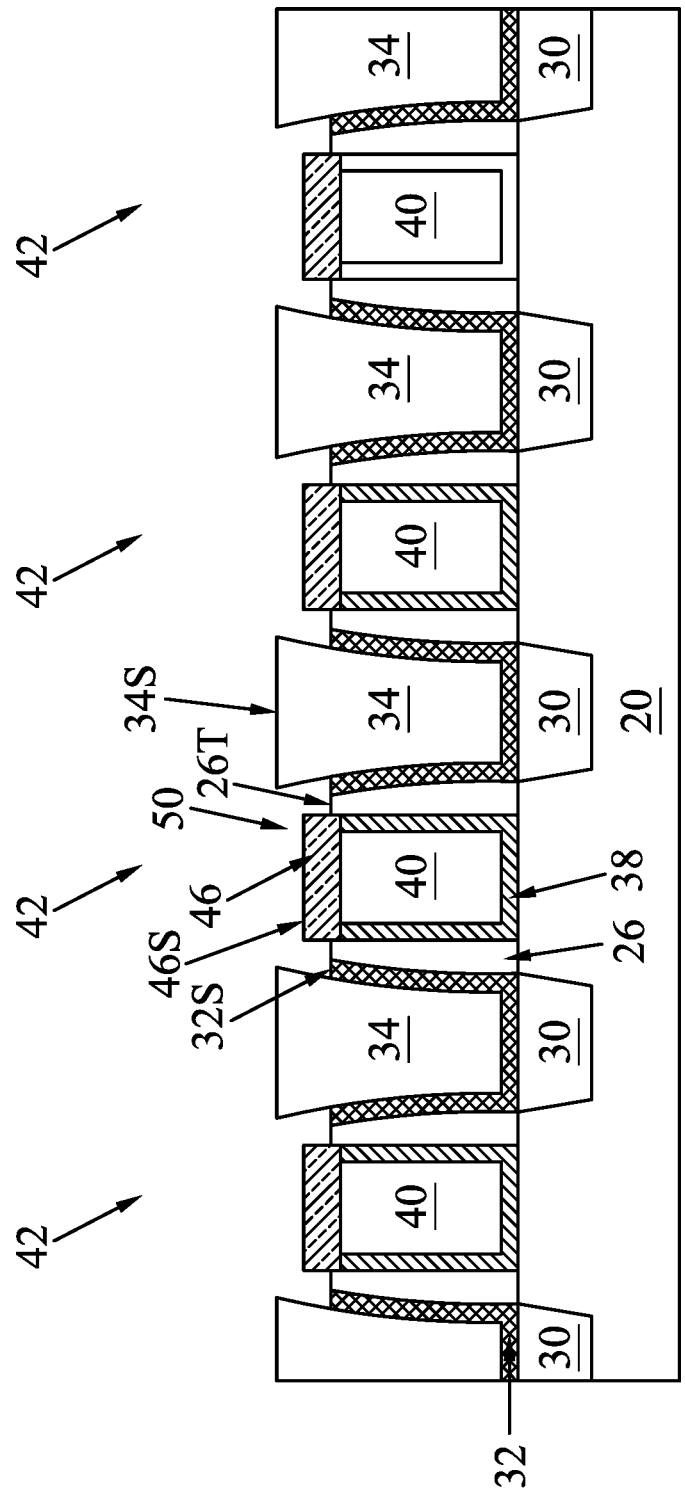
FIGS. 17 through 24 illustrate cross-sectional views of intermediate stages in the manufacturing of a semiconductor device in accordance with some embodiments.

FIG. 17 through 24 illustrate intermediate steps in the formation of a self-aligned contact, in accordance with some embodiments. The structure illustrated in FIG. 17 results from the process described above with respect to FIGS. 2 through 8, following additional processes. FIG. 17 illustrates recessing the first hard mask layer 46 of FIG. 8 to form recesses 50. The first hard mask layer 46, the etch stop layer 32, and the gate spacers 26 are recessed such that top surfaces 46S, 32S, and 26T of the first hard mask layer 46, the etch stop layer 32, and the gate spacers 26, respectively, are below top surfaces 34S of the ILD 34.

Further, the bottom surfaces of the recesses 50 may have a flat surface as illustrated, a convex surface, a concave surface (such as dishing), or a combination thereof. The bottom surfaces of the recesses 50 may be formed flat, convex, and/or concave by an appropriate etch. The first hard mask layer 46 may be recessed using an acceptable etching process, such as one that is selective to the materials of the first hard mask layer 46, the etch stop layer 32, and the gate spacer 26. For example, an etch process may include the formation of a reactive species from an etchant gas using a plasma. In some embodiments, the plasma may be a remote plasma. In some embodiments, the etchant gas may include a fluorocarbon chemistry such as $CH_3F/CH_2F_2/CHF_3/C_4F_6/CF_4/C_4F_8$ and $NF_3/O_2/N_2/Ar/H_2/CH_4/CO/CO_2/COS$, the like, or a combination thereof. In some embodiments, the etchant gas may be supplied to the etch chamber at a total gas flow of from about 5 to about 1000 sccm. In some embodiments, the pressure of the etch chamber during the etch process is from about 10 mtorr to about 50 mtorr. In some embodiments, the etchant gas may comprise between about 5 to about 95 percent hydrogen gas. In some embodiments, the etchant gas may comprise between about 5 to about 95 percent inert gas.

In another embodiment, the etching may be a wet etch using a suitable etchant such as $H_3PO_4$, or the like. In such embodiments, a further mask (not shown) may be patterned and used over the ILD 34 to provide protection of the ILD 34 during the etching process. As the first hard mask layer 46 is etched and reduced in thickness, a lateral etch may proceed outwardly from the first hard mask layer 46 over the gate electrodes 40 to remove exposed portions of the gate spacers 26 and etch stop layer 32. In some embodiments, the lateral etch may continue partially into the sidewalls of the ILD 34.

Further, the exposed upper surfaces of gate spacer 26 (and the etch stop layer 32, in some embodiments) may be recessed below an upper surface of the first hard mask layer 46 by prolonged etching of these layers and/or by changing the etchant gas or process conditions. In some embodiments the distance between the upper surface of the first hard mask layer 46 and the upper surface of the gate spacer 26 may be between about 0.5 nm to about 10 nm, such as about 4 nm. Recessing the upper surface of the gate spacer 26 provides room for a subsequently formed second hard mask layer to wrap around an upper portion of the first hard mask layer 46 to provide additional protection of the first hard mask layer 46, and the gate electrode 40, which underlies the first hard mask layer 46.

Figure 18:
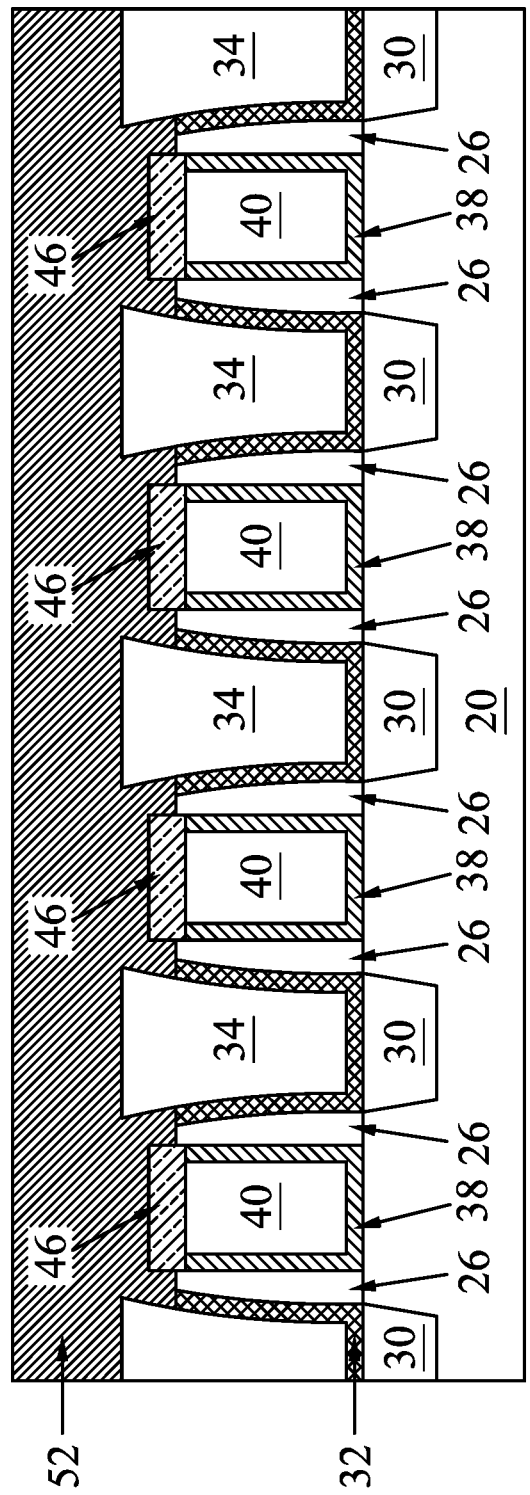

In FIG. 18, a second hard mask layer 52 is formed over the first hard mask layer 46, the gate spacers 26, the etch stop layer 32, and the ILD 34 and within the recesses 50. FIG. 18 is similar to FIG. 10, where like reference numbers indicate like elements formed using like processes.

Figure 19:
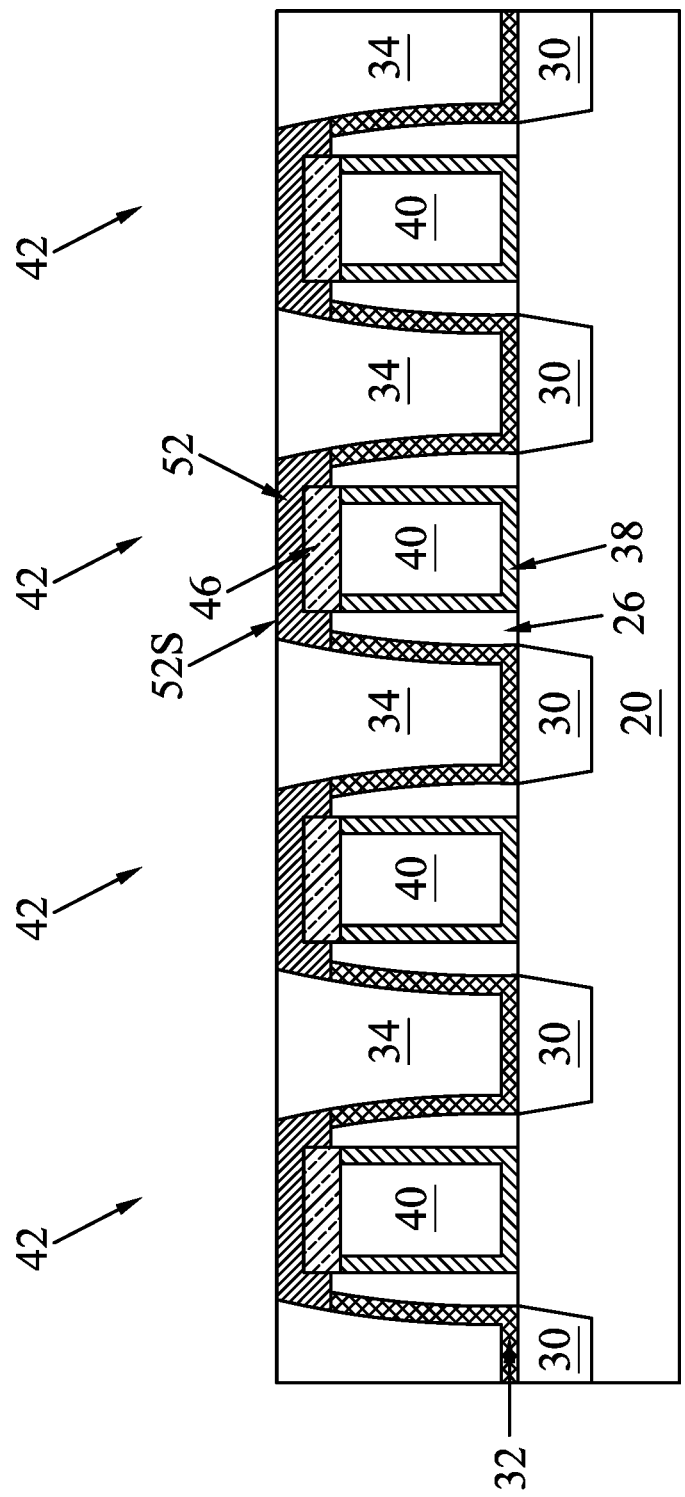

In FIG. 19, a planarization process, such as a CMP process, may be performed to level the top surface 34S of the ILD 34 with top surfaces 52S of the second hard mask layer 52. Accordingly, top surfaces 34S of the ILD 34 are exposed. After planarization, the thickness of the second hard mask layer 52 over the first hard mask layer 46 may be between about 0.5 nm and about 10 nm, such as about 5 nm. As such, the thickness of the second hard mask layer 52 over the gate spacer 26, may be between about 1 nm and about 20 nm, such as about 9 nm, as a result of the outer legs of the second hard mask layer 52 that extend downward along the sidewalls of the first hard mask layer 46.

Figure 20:
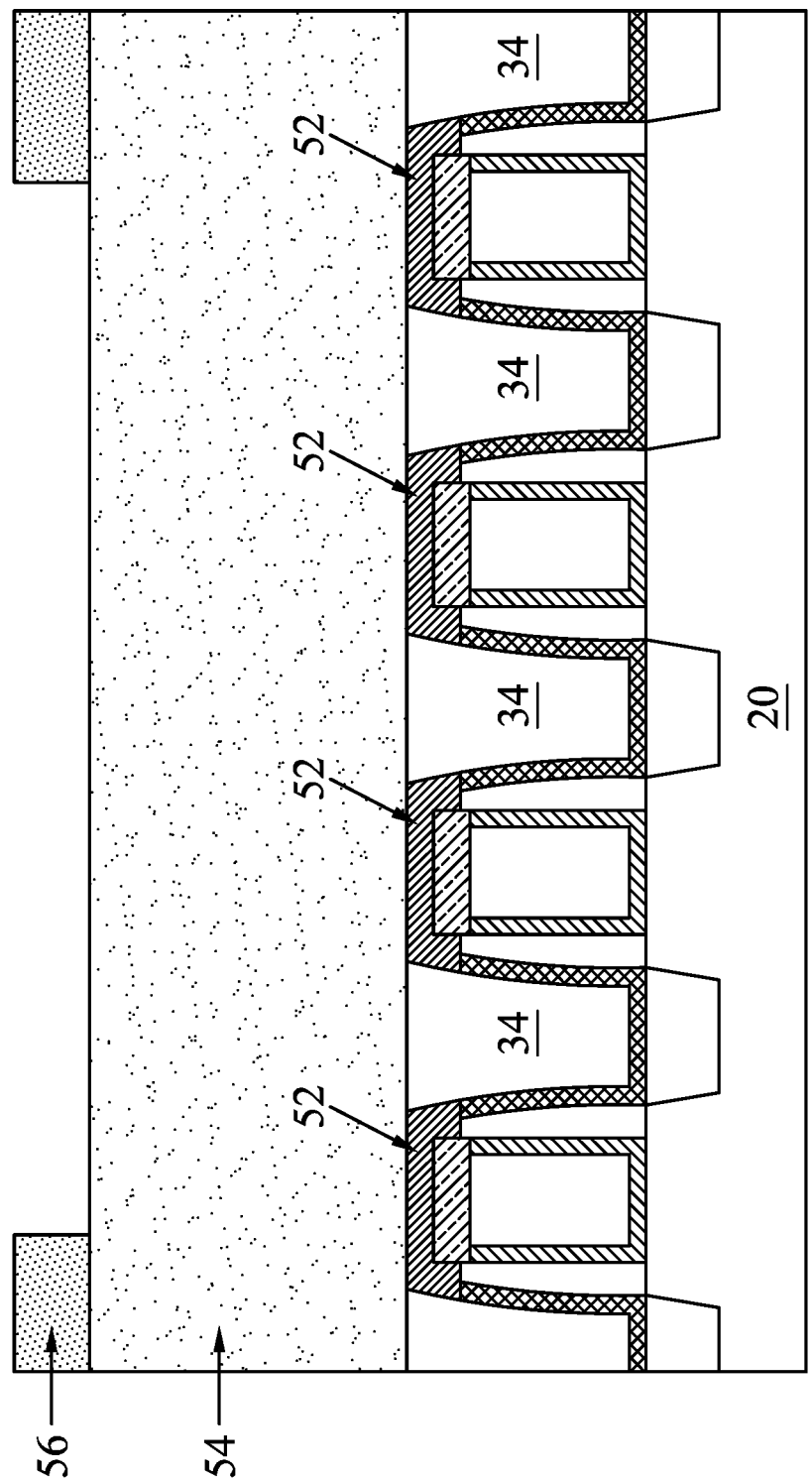

In FIG. 20, an ILD 54 is deposited over the structure illustrated in FIG. 19, and a hard mask layer 56 is formed over the ILD 54 and patterned. FIG. 20 is similar to FIG. 12, where like reference numbers indicate like elements formed using like processes.

Figure 21:
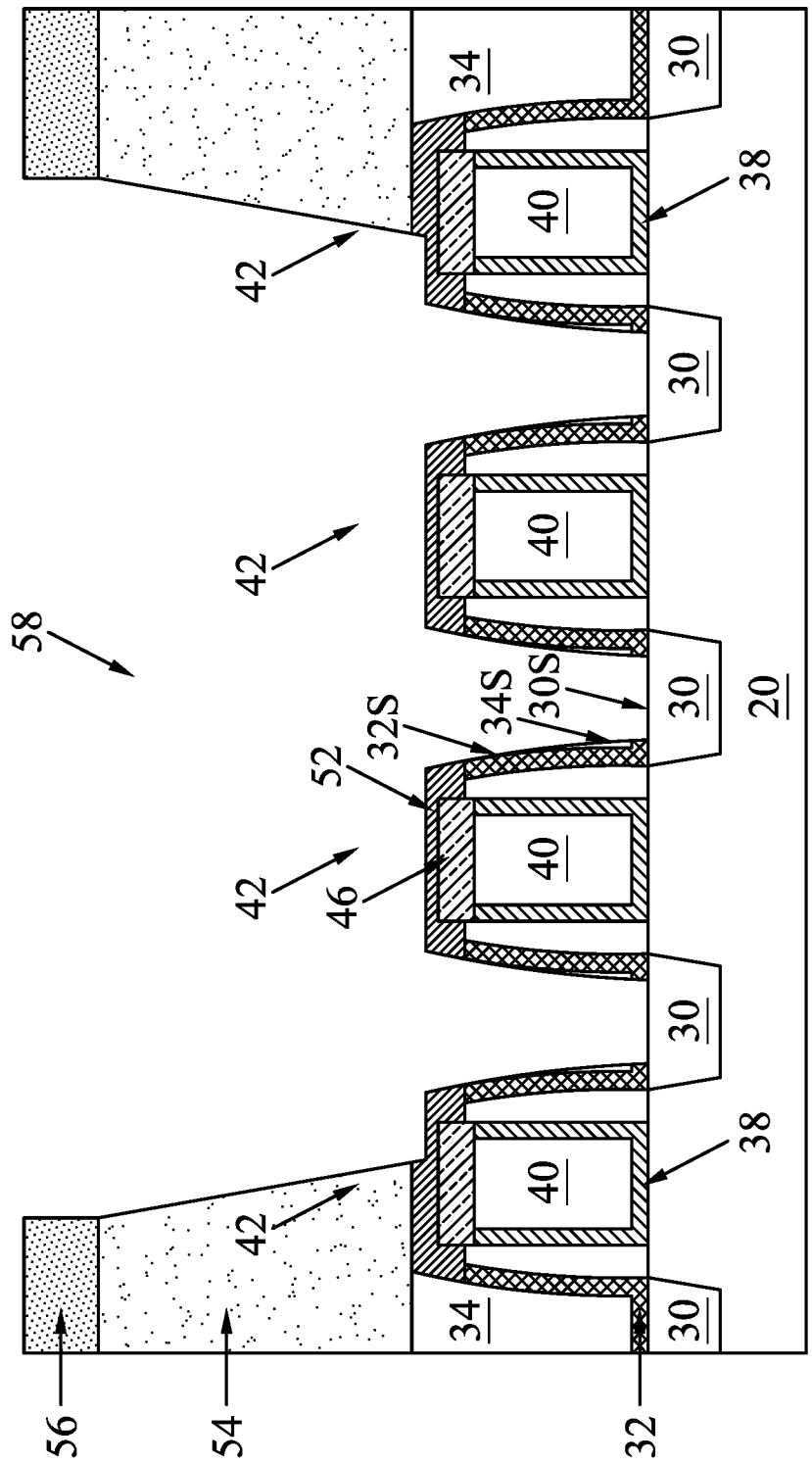

FIG. 21 illustrates the formation of the openings 58 through the ILD 54 and through the ILD 34 using the patterned hard mask layer 56 as a mask to expose portions of the substrate 20. FIG. 21 is similar to FIG. 13, where like reference numbers indicate like elements formed using like processes. It is noted, however, that the extended downward legs of the second hard mask layer 52 provides better protection for the first hard mask layer 46 than the second hard mask layer 52 as illustrated in FIG. 13.

Figure 22:
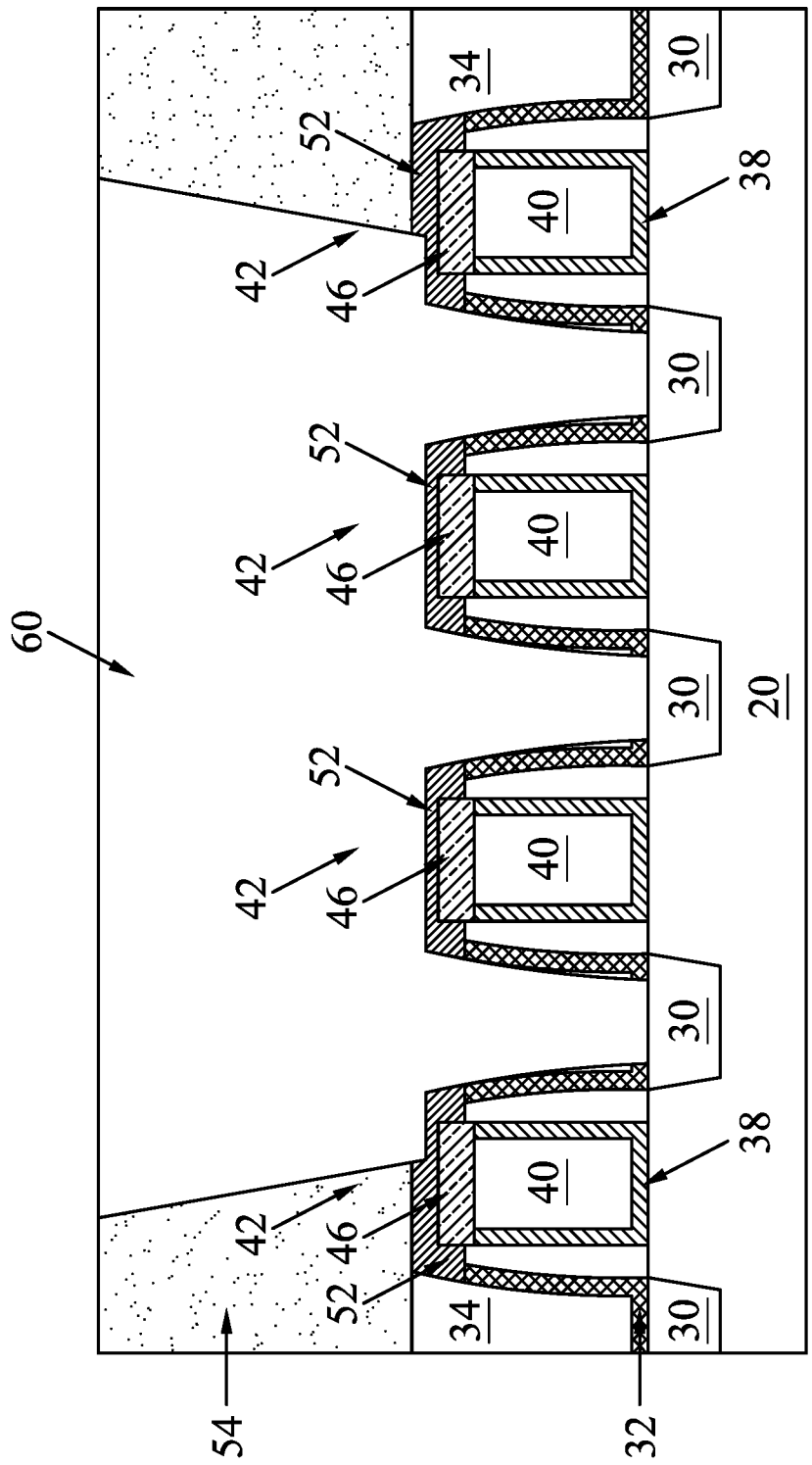

FIG. 22 illustrates the formation of a conductive layer 60 in the openings 58. FIG. 22 is similar to FIG. 14, where like reference numbers indicate like elements formed using like processes.

Figure 23:
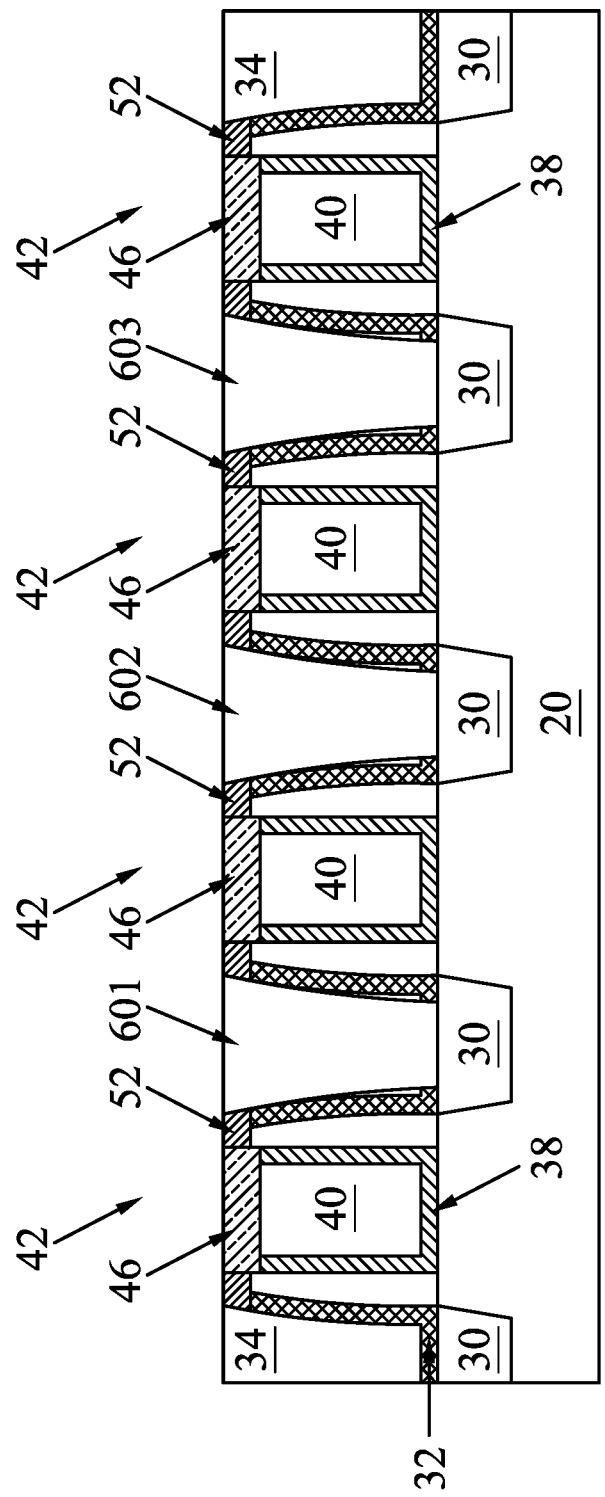

FIG. 23 illustrates the removal of the ILD 54, portions of the second hard mask layer 52, and the portion of the ILD 34 and the conductive layer 60 at levels above the top surfaces of the first hard mask layer 46. This removal may be performed by one or more etching processes and/or grinding processes such as CMP processes. After the removal process, the conductive layer 60 is separated into conductive features 60₁, 60₂, and 60₃. In addition, after the removal process, the top surfaces of the conductive features 60₁, 60₂, and 60₃ are level with the top surface of the ILD 34 and the first hard mask layer 46. In some embodiments, as illustrated in FIG. 23, portions of the second hard mask layer 52 may remain on either side of the first hard mask layer 46, over an upper surface of the gate spacers 26 and an upper surface of the etch stop layer 32. In other embodiments, these portions of the second hard mask layer 52 may be removed by the removal process of FIG. 23, that is, removing the first hard mask layer 46 and second hard mask layer 52 until the second hard mask layer 52 is completely removed.

Figure 24:
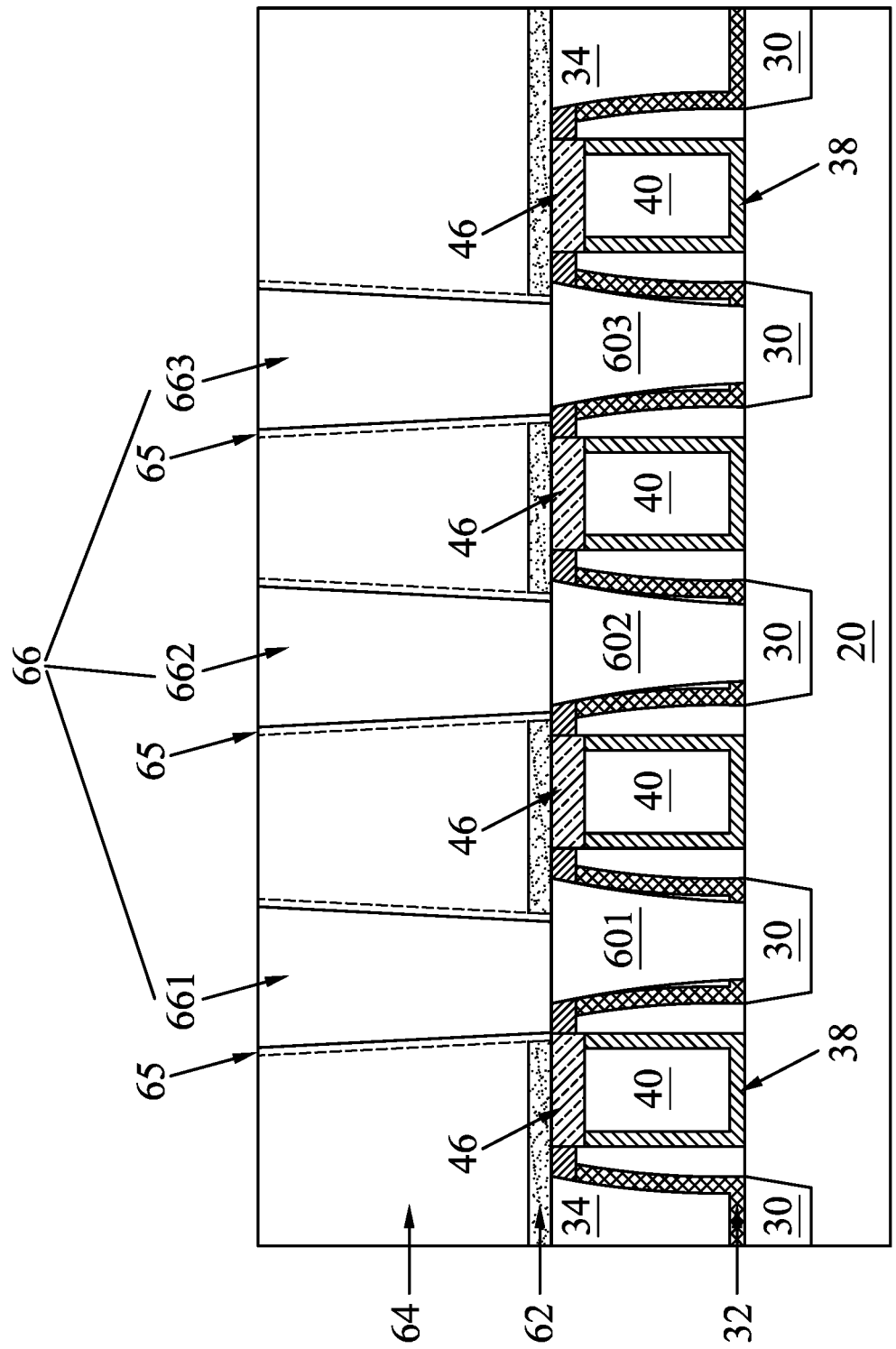

FIG. 24 illustrates the formation of an etch stop layer 62 over the structure of FIG. 23. Further in FIG. 24, an ILD 64 is deposited over the etch stop layer 62, and contacts 66₁, 66₂, and 66₃ are formed through the ILD 64 and the etch stop layer 62 to electrically and physically contact respective conductive features 60₁, 60₂, and 60₃. FIG. 24 is similar to FIG. 16, where like reference numbers indicate like elements formed using like processes.

Figure 25:
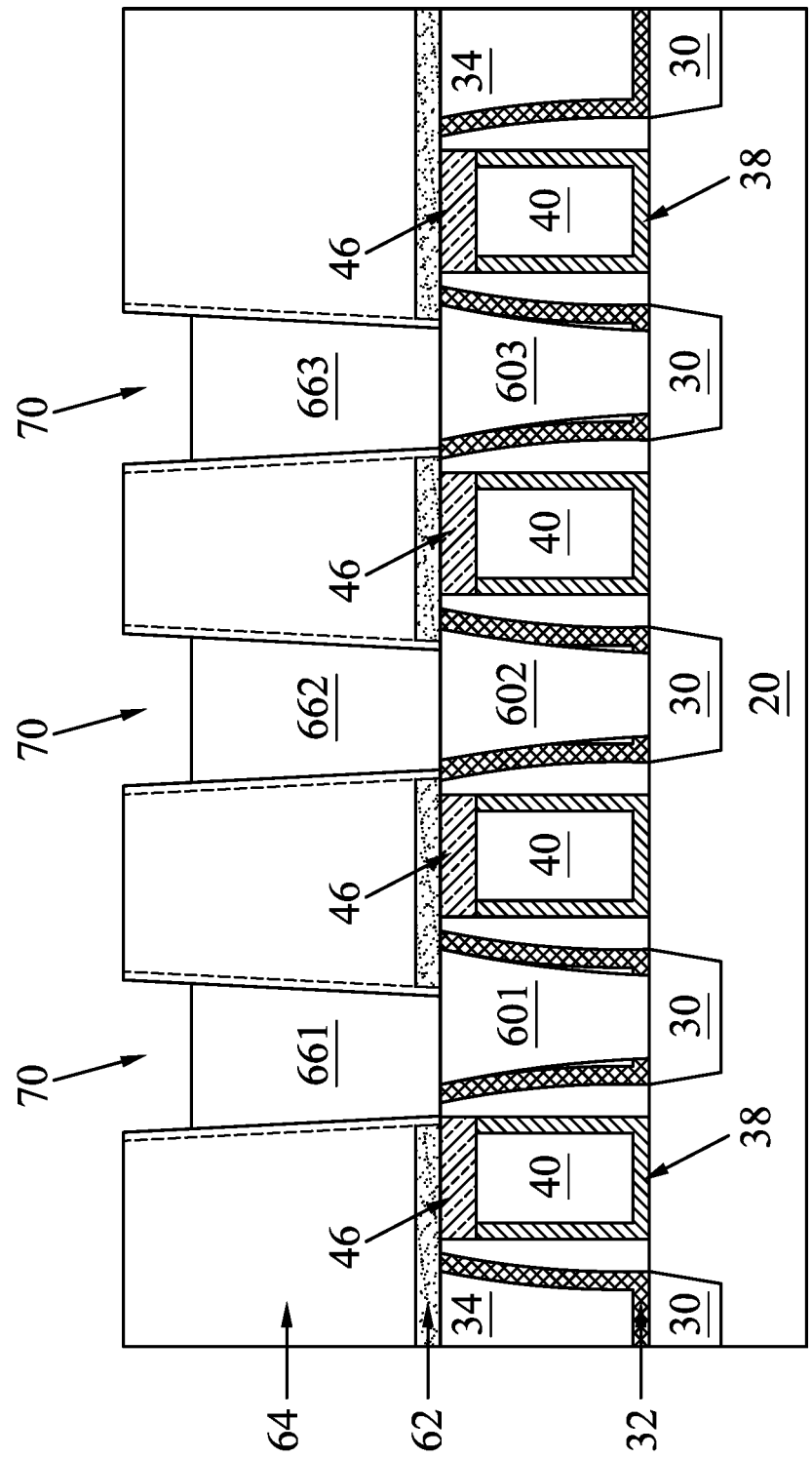
FIGS. 25 through 31 illustrate cross-sectional views of intermediate stages in the manufacturing of a semiconductor device in accordance with some embodiments.

FIGS. 25 through 31 illustrate a process of forming a mask layer over the contacts 66₁, 66₂, and 66₃ to provide protection of the contacts 66₁, 66₂, and 66₃, during a subsequent process of forming gate contacts. The process illustrated in FIGS. 25 through 31 are based on the structure illustrated in FIG. 16, however one will understand that the process may also be performed on the structure as illustrated in FIG. 24. In FIG. 25, the upper surfaces of the contacts 66₁, 66₂, and 66₃ are recessed. The contacts 66₁, 66₂, and 66₃ may be recessed using a suitable etching technique to remove a portion of the conductive material of the contacts 66₁, 66₂, and 66₃ and form recesses 70.

Figure 26:
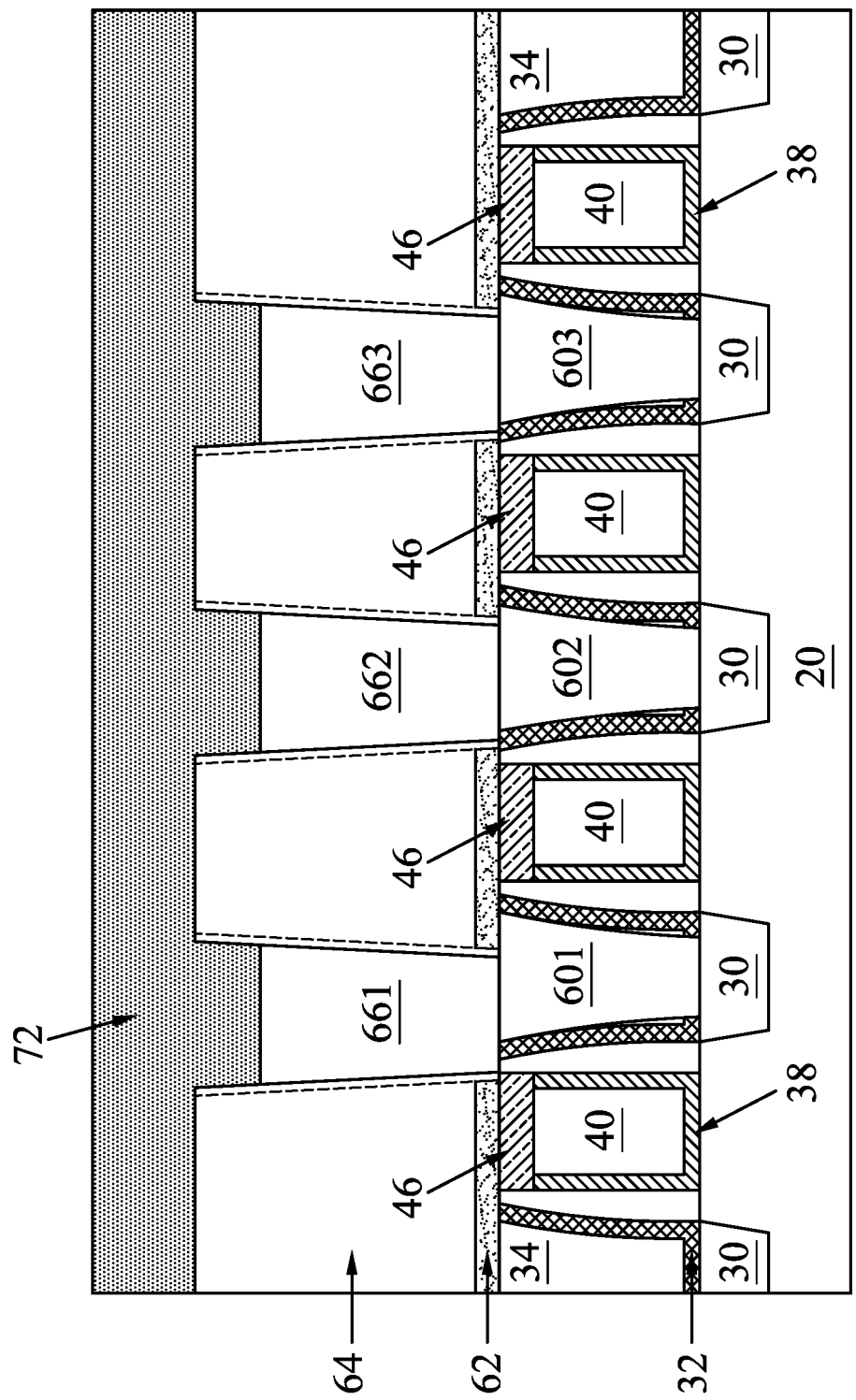

In FIG. 26, a first hard mask layer 72 is formed over the ILD 64 and within the recesses 70 over the contacts 66₁, 66₂, and 66₃. The first hard mask layer 72 may be made of SiN, SiON, SiO₂, the like, or a combination thereof. The first hard mask layer 72 may be formed by CVD, PVD, ALD, a spin-on-dielectric process, the like, or a combination thereof.

Figure 27:
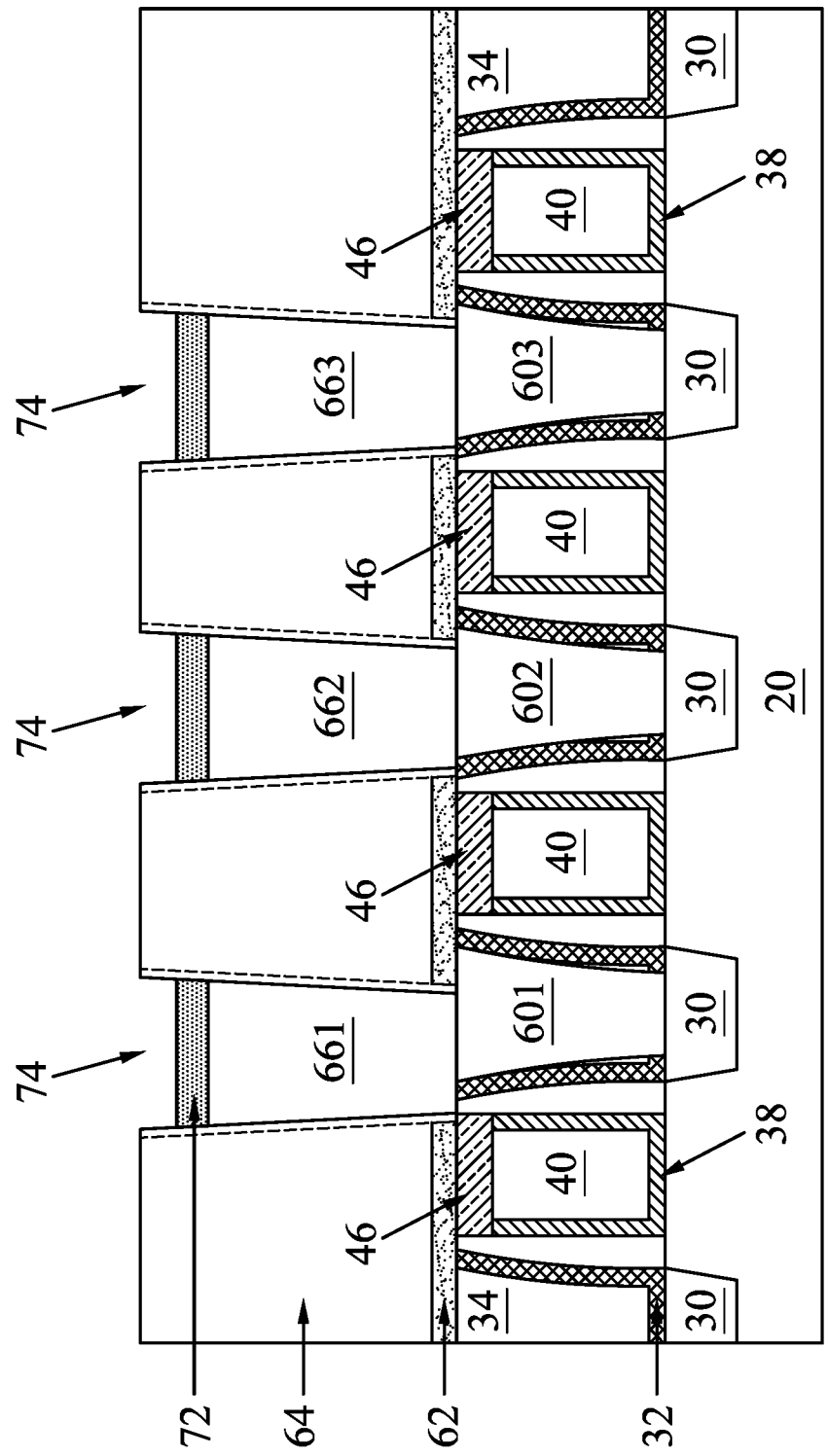

In FIG. 27, the first hard mask layer 72 may be recessed to form recesses 74. The bottom surfaces of the recesses 74 may have a flat surface as illustrated, a convex surface, a concave surface (such as dishing), or a combination thereof. The bottom surfaces of the recesses 74 may be formed flat, convex, and/or concave by an appropriate etch. The first hard mask layer 72 may be recessed using an acceptable etching process, such as one that is selective to the materials of the first hard mask layer 72. Etching may be performed using processes and materials similar to that discussed above with respect to the first hard mask layer 46.

Figure 28:
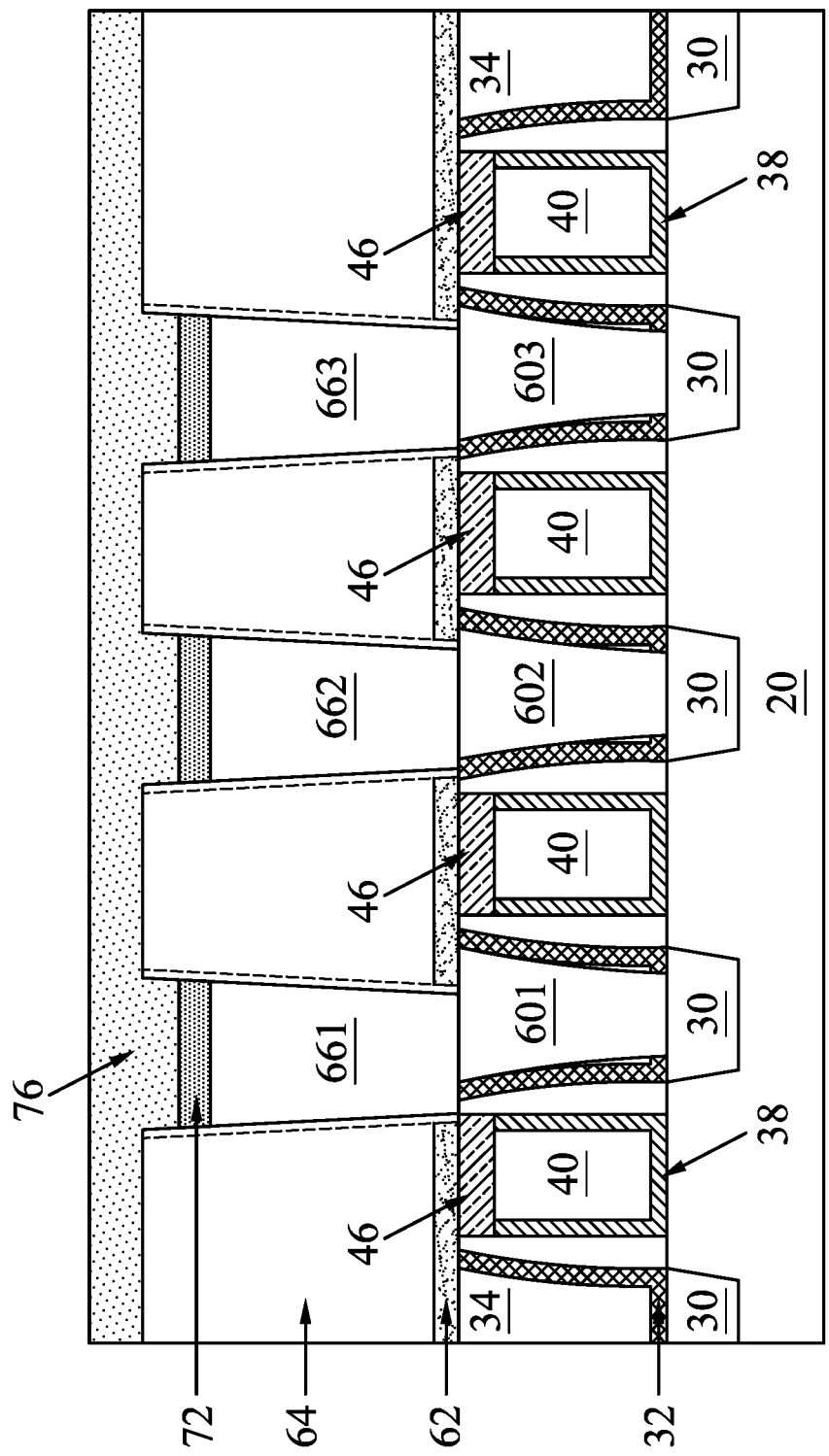

In FIG. 28, a second hard mask layer 76 is formed over the first hard mask layer 72 within the recesses 74. The second hard mask layer 76 provides protection of the contacts 66₁, 66₂, and 66₃ during the formation of a self-aligned gate contact to prevent the gate contact from shorting to the contacts 66₁, 66₂, and 66₃. The second hard mask layer 76 may be formed using materials and processes similar to those discussed above with respect to the second hard mask layer 52 of FIG. 10.

Figure 29:
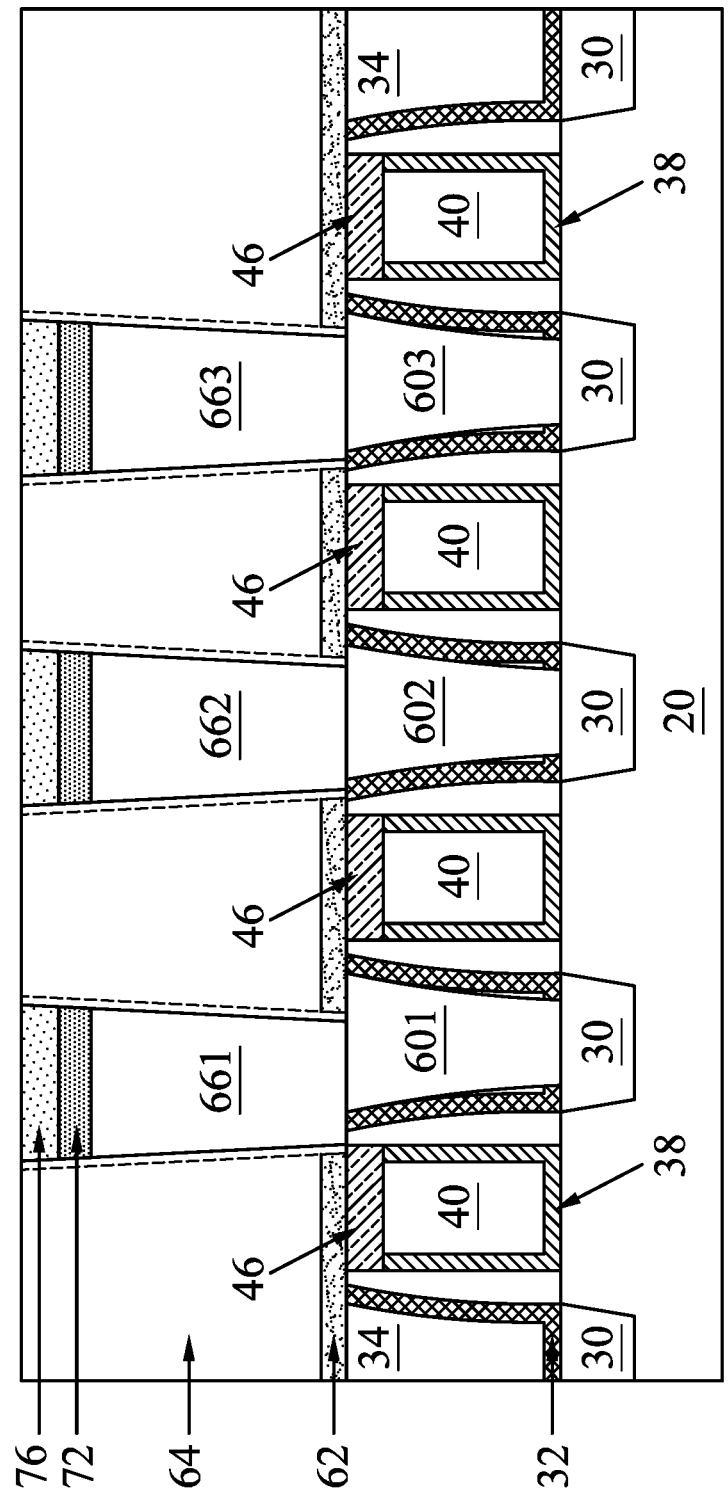

In FIG. 29, the second hard mask layer 76 may be recessed, for example, using a planarization process, such that the upper surface of the second hard mask layer is level with an upper surface of the ILD 64.

Figure 30:
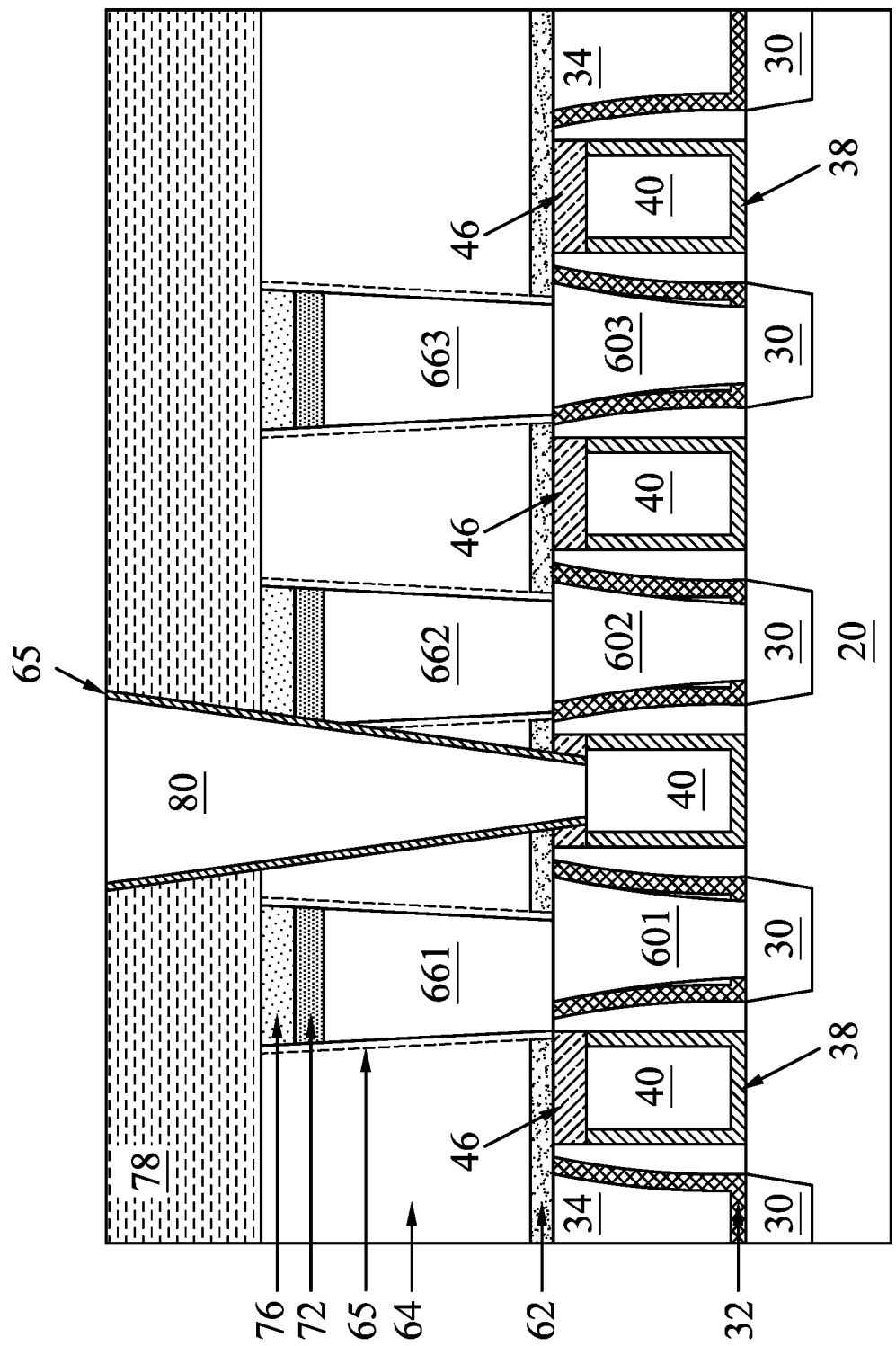

In FIG. 30, an ILD 78 is deposited over the ILD 64 and patterned to form openings therein for the gate contacts 80. It should be understood that although, the gate contact 80 is shown in this cross-section, the gate contact 80 may be in a different cross-section. As illustrated in FIG. 30, the second hard mask 76 prevents the opening which is formed from exposing the contact 66₂. The subsequently formed gate contact 80 may have a portion of the second hard mask 76 embedded in the gate contact 80. The liner layer 65 also provides sidewall protection for the contact 66₂ during forming the opening for the gate contact 80.

The gate contact 80 may be formed using any suitable process. For example, the gate contact 80 may be formed using process and materials similar to those discussed above with respect to the formation of contacts 66₁, 66₂, and 66₃. It should also be understood that the FIG. 30 is merely illustrative and additional gate contacts may be formed simultaneously. As illustrated in FIG. 30, a liner layer 65 may be used, similar to that discussed above with respect to the formation of contacts 66₁, 66₂, and 66₃.

In some embodiments, the gate contact 80 is formed to have excess material overlying a top surface of the ILD 78. In these embodiments, the gate contact 80 is planarized by a grinding process such as a CMP process to form individual gate contacts. In some embodiments, the top surfaces of the gate contacts 80 are level with the top surface of the ILD 78 after the planarization process.

Figure 31:
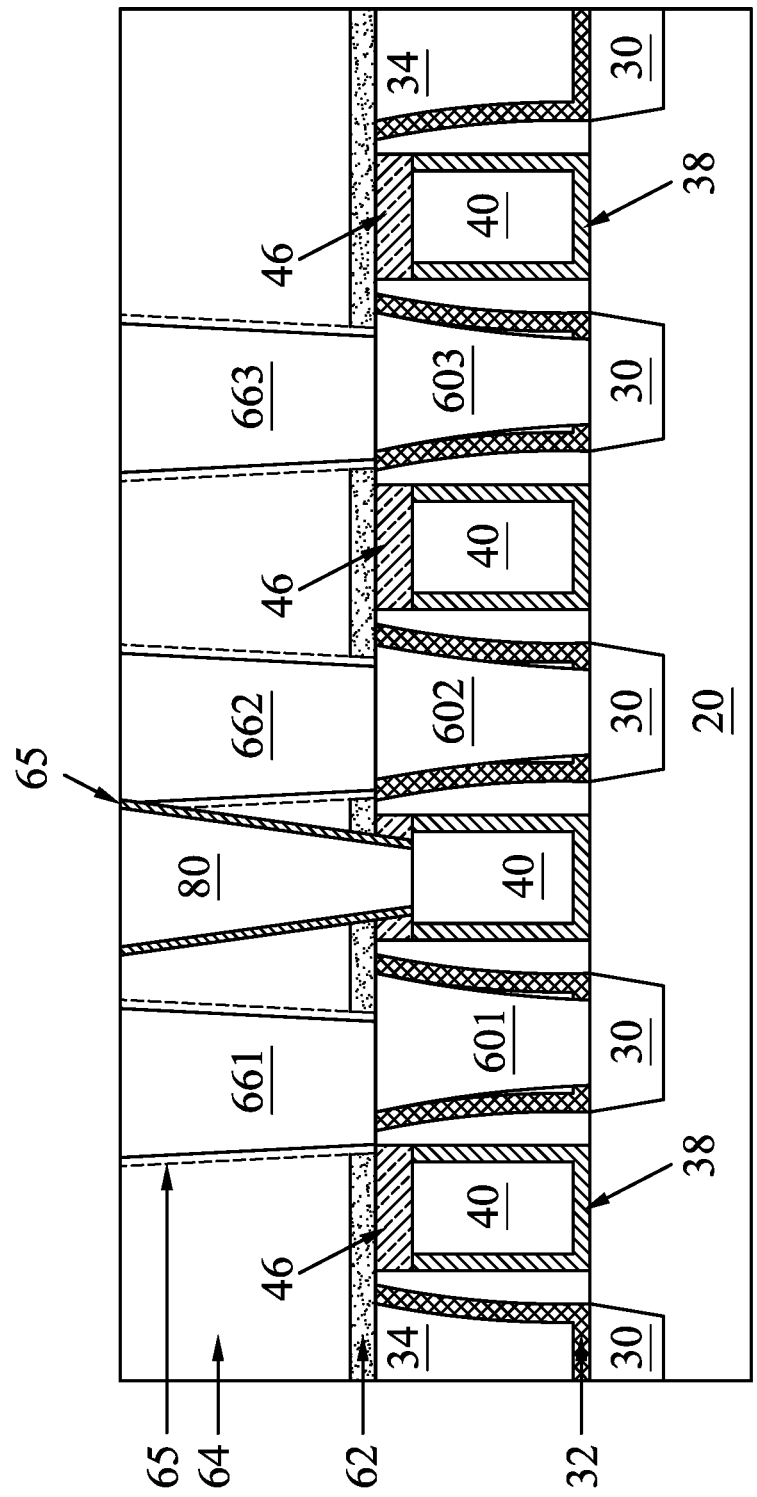

FIG. 31 illustrates the removal of the ILD 78, the second hard mask layer 76, first hard mask layer 72, a portion of the ILD 64, and an upper portion of gate contacts 80 to level the upper surfaces of the ILD 64 and gate contacts 80 with upper surfaces of contacts 661, 662, and 663. This removal may be performed by one or more etching processes and/or grinding processes such as CMP processes.

Embodiments of the present disclosure provide a self-aligned contact formation process which utilizes a second hard mask layer which protects a first hard mask layer. The second hard mask layer has a greater etch selectivity over the first hard mask layer and so provides better protection during forming the self-aligned contact opening. A similar process may be used to provide a series of hard mask layers over the source/drain contact to protect the source/drain contact during a self-aligned contact process for the gate drain.

One embodiment is a method including forming a first gate over a substrate, forming a first dielectric layer over the substrate and surrounding the first gate, and forming a first hard mask layer over the first gate. The first hard mask has a first etch selectivity. A second hard mask layer is formed over the first hard mask layer, the second hard mask having a second etch selectivity greater than the first etch selectivity. A second dielectric layer is formed over the first gate and the first dielectric layer. A first opening is etched through the second dielectric layer and the first dielectric layer to expose a first source/drain region adjacent the first gate and a second source/drain region adjacent the first gate, the second etch selectivity of the second hard mask protecting the first hard mask from being etched. The first opening is filled with a conductive material. The second hard mask layer, the conductive material, and the second dielectric layer are recessed to level top surfaces of the first hard mask layer, the conductive material, and the first dielectric layer, the recessed conductive material forming a first conductive contact to the first source/drain region and a second conductive contact to the second source/drain region.

Another embodiment is a method including forming a first metal gate over a substrate, the first metal gate having first gate spacers on opposing sidewalls of the first metal gate. A first dielectric layer is formed over the substrate and adjacent the first metal gate. The first metal gate is recessed to have a top surface below a top surface of a the first dielectric layer. A first hard mask layer is formed on the recessed top surface of the first metal gate. The first hard mask layer and the first gate spacers are recessed to have top surfaces below the top surface of the first dielectric layer. The first gate spacers are recessed to have top surfaces below the top surface of the first hard mask layer. A second hard mask layer is deposited on the recessed top surfaces of the first hard mask layer and the first gate spacers, the second hard mask layer extending down a sidewall of the first hard mask layer.

Another embodiment is a device including a first gate, the first gate including a gate dielectric, a gate electrode, and first gate spacers disposed on opposing sides of the gate electrode. The device also includes a first hard mask layer over the gate electrode, the first gate spacers extending along a first portion of sidewalls of the first hard mask layer. The device further includes a second hard mask layer disposed over the first gate spacers, the second hard mask layer being a different material than a material of the first hard mask layer, the second hard mask layer extending along a second portion of sidewalls of the first hard mask layer. The device also includes a first source/drain contact adjacent the first gate spacers.

Another embodiment is a device including a first gate which may include a gate dielectric, a gate electrode, and a first gate spacer and a second gate spacer disposed on opposing sides of the gate electrode. The device also includes a first hard mask layer over the gate electrode, the first gate spacer extending along a first portion of a sidewall of the first hard mask layer. The device also includes a second hard mask layer disposed over the first gate spacer, the second hard mask layer being a different material than a material of the first hard mask layer, the second hard mask layer extending along a second portion of the sidewall of the first hard mask layer. The device also includes a first source/drain contact adjacent the first gate spacer.

Another embodiment is a device including a first transistor and a second transistor. The first transistor includes: a first gate, and a first source/drain and a second source/drain on opposing sides of the first gate. The second transistor includes: a second gate, the second source/drain and a third source/drain on opposing sides of the second gate. The device also includes a first etch stop layer having an interface with the first gate. The device also includes a second etch stop layer having an interface the second gate. The device also includes a first hard mask disposed over the first etch stop layer. The device also includes a second hard mask disposed over the second etch stop layer.

Another embodiment is a device including a first gate disposed over a channel region, where the first gate may include a gate electrode, a gate mask over the gate electrode, and a first gate spacer and a second gate spacer on opposing sides of the gate electrode, and a first source/drain and a second source/drain on opposing sides of the first gate. The device also includes a first hard mask disposed over the first gate spacer. The device also includes a second hard mask disposed over the second gate spacer, where the first hard mask and second hard mask have upper surfaces level with an upper surface of the gate mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first gate comprising a gate dielectric, a gate electrode, and a first gate spacer and a second gate spacer disposed on opposing sides of the gate electrode;
a first hard mask layer over the gate electrode, the first gate spacer extending along a first portion of a sidewall of the first hard mask layer;
a second hard mask layer disposed over the first gate spacer, the second hard mask layer being a different material than a material of the first hard mask layer, the second hard mask layer extending along a second portion of the sidewall of the first hard mask layer; and a first source/drain contact adjacent the first gate spacer.

2. The device of claim 1, wherein the first source/drain contact is in contact with the second hard mask layer.

3. The device of claim 1, further comprising:

an inter layer dielectric (ILD) layer disposed over the first gate; and a second source/drain contact embedded in the ILD layer, the second source/drain contact electrically and physically coupled to the first source/drain contact, the second source/drain contact physically in contact with the second hard mask layer.

4. The device of claim 3, further comprising:

a gate contact extending through the ILD layer and through the first hard mask layer to contact the gate electrode.

5. The device of claim 1, wherein the second hard mask layer comprises silicon, a metal oxide, or tungsten carbide.

6. The device of claim 1, further comprising an etch stop layer interposed between the first gate spacer and the first source/drain contact.

7. The device of claim 6, wherein the second hard mask layer is disposed on an upper surface of the etch stop layer.

8. The device of claim 1, wherein an upper surface of the first gate spacer is below an upper surface of the first hard mask layer.

9. The device of claim 8, wherein the upper surface of the first gate spacer is below the upper surface of the first hard mask layer by 0.5 nm to 10 nm.

10. A device comprising:

a first transistor including:

a first gate, wherein the first gate comprises a gate hard mask disposed over a gate electrode, wherein the first gate comprises a first gate spacer and a second gate spacer disposed on either side of the gate electrode and gate hard mask, and a first source/drain and a second source/drain on opposing sides of the first gate;

a second transistor including:

a second gate, and the second source/drain and a third source/drain on opposing sides of the second gate;

a first etch stop layer having an interface with the first gate;

a second etch stop layer having an interface the second gate;

a first hard mask disposed over the first etch stop layer, wherein the first hard mask is in contact with a sidewall of the gate hard mask; and a second hard mask disposed over the second etch stop layer.

11. The device of claim 10, further comprising:

a source/drain contact to the second source/drain interposed between the first gate and the second gate, the source/drain contact having a third interface with the first etch stop layer and a fourth interface with the second etch stop layer.

12. The device of claim 11, further comprising an upper source/drain contact disposed over the source/drain contact, the upper source/drain contact overlapping the first hard mask.

13. The device of claim 10, wherein the first hard mask extends over an upper surface of the first gate spacer.

14. The device of claim 10, wherein the first etch stop layer extends along a sidewall of the first gate spacer and contacts an upper surface of the first source/drain.

15. The device of claim 10, wherein an upper surface of the first hard mask is level with an upper surface of the gate hard mask.

16. A device comprising:

a first gate disposed over a channel region, the first gate comprising a gate electrode, a gate mask over the gate electrode, and a first gate spacer and a second gate spacer on opposing sides of the gate electrode, and a first source/drain and a second source/drain on opposing sides of the first gate;

a first hard mask disposed over the first gate spacer; and a second hard mask disposed over the second gate spacer, wherein the first hard mask and second hard mask have upper surfaces level with an upper surface of the gate mask.

17. The device of claim 16, further comprising:

a first etch stop layer, the first etch stop layer having an interface with the first gate spacer, the first hard mask extending over an upper surface of the first gate spacer.

18. The device of claim 16, wherein a material composition of the gate mask is different than a material composition of the first hard mask.

19. The device of claim 16, further comprising a source/drain contact disposed above the first source/drain, the source/drain contact having an upper surface level with an upper surface of the first hard mask.

20. The device of claim 19, wherein the source/drain contact contacts a sidewall of the first hard mask.

* * * * *